(12) United States Patent
Kajiwara

(10) Patent No.: US 11,102,433 B2
(45) Date of Patent: Aug. 24, 2021

(54) SOLID-STATE IMAGING DEVICE HAVING A PHOTOELECTRIC CONVERSION ELEMENT WITH MULTIPLE ELECTRODES

(71) Applicant: Sony Semiconductor Solutions Corporation, Kanagawa (JP)

(72) Inventor: Yuu Kajiwara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/318,993

(22) PCT Filed: May 9, 2018

(86) PCT No.: PCT/JP2018/017929
§ 371 (c)(1),
(2) Date: Jan. 18, 2019

(87) PCT Pub. No.: WO2019/031001
PCT Pub. Date: Feb. 14, 2019

(65) Prior Publication Data
US 2020/0382737 A1 Dec. 3, 2020

(30) Foreign Application Priority Data
Aug. 9, 2017 (JP) .............................. JP2017-153751

(51) Int. Cl.
*H04N 5/335* (2011.01)
*H04N 5/374* (2011.01)
(Continued)

(52) U.S. Cl.
CPC ........... *H04N 5/3741* (2013.01); *G01S 17/89* (2013.01); *H01L 27/14612* (2013.01);
(Continued)

(58) Field of Classification Search
CPC ............................ H04N 5/3741; H04N 5/378;
H01L 27/14612; H01L 27/14623; H01L 27/14643; H01L 27/14831
(Continued)

(56) References Cited

U.S. PATENT DOCUMENTS 8,659,108 B2 * 2/2014 Van Niewenhove ..... G01J 3/28
257/440
2005/0051730 A1 * 3/2005 Kuijk .................... G01S 7/4816
250/370.01
(Continued)

FOREIGN PATENT DOCUMENTS

| CN | 102044547 A | 5/2011 |
| CN | 106575658 A | 4/2017 |

(Continued)

OTHER PUBLICATIONS

International Search Report and English translation thereof dated Jul. 31, 2018 in connection with International Application No. PCT/JP2018/017929.
(Continued)

*Primary Examiner* — Usman A Khan
(74) *Attorney, Agent, or Firm* — Wolf, Greenfield & Sacks, P.C.

(57) ABSTRACT

To enhance, in the device that transfers the electric charges in the photodiode, the transfer efficiency of the electric charges.
A photoelectric conversion element in a solid-state imaging device is provided with a plurality of electrodes and a plurality of detection terminals. A driver generates at a same time in the photoelectric conversion element a plurality of electric fields having directions different from each other by supplying a potential to each of the plurality of electrodes so as to transfer electric charges from all of terminals not corresponding to a transfer destination out of the plurality of
(Continued)

detection terminals to a terminal at the transfer destination. A detection section detects a signal corresponding to an amount of the electric charges transferred to the terminal at the transfer destination.

13 Claims, 37 Drawing Sheets

(51) Int. Cl.
  H01L 27/146 (2006.01)
  H01L 27/148 (2006.01)
  H04N 5/378 (2011.01)
  G01S 17/89 (2020.01)
(52) U.S. Cl.
  CPC .. H01L 27/14623 (2013.01); H01L 27/14643 (2013.01); H01L 27/14831 (2013.01); H04N 5/378 (2013.01)
(58) Field of Classification Search
  USPC .......................................................... 348/308
  See application file for complete search history.

(56) References Cited

U.S. PATENT DOCUMENTS

| 2011/0255071 A1 | 10/2011 | Van Der Tempel et al. |
| 2017/0301708 A1* | 10/2017 | Fotopoulou ............. H01L 31/11 |
| 2018/0054581 A1 | 2/2018 | Sano et al. |

FOREIGN PATENT DOCUMENTS

| EP | 1 513 202 | 3/2005 |
| EP | 2 330 637 A2 | 6/2011 |
| EP | 2330637 A2 | 6/2011 |
| EP | 2 960 952 | 12/2015 |
| EP | 3 193 190 A1 | 7/2017 |
| EP | 3 193 369 | 7/2017 |
| JP | 2011-086904 A | 4/2011 |
| JP | 2017-522727 A | 8/2017 |
| WO | WO 2016/167044 A1 | 10/2016 |
| WO | WO 2017/121820 A1 | 7/2017 |

OTHER PUBLICATIONS

Extended European Search Report dated Jan. 31, 2020 in connection with European No. Application No. 18844563.9.
International Preliminary Report on Patentability dated Feb. 20, 2020 in connection with International Application No. PCT/JP2018/017929, and English translation thereof.
Dalla-Betta et al., TOF-Range Image Sensor in 0.18μm CMOS technology based on Current Assisted Photonic Demodulators. OSA/CLEO (Optical Society of America; Lasers and Electro-Optics. Laser Science to Photonic Applications. May 2011. pp. 1-2.
Lin et al., Color range images captured by a four-phase CMOS image sensor. IEEE Transactions on Electron Devices, IEEE Service Center. vol. 58(3); Mar. 2011. pp. 732-739.
Written Opinion and English translation thereof dated Jul. 31, 2018 in connection with International Application No. PCT/JP2018/017929.
Chinese Office Action dated Nov. 13, 2020 in connection with Chinese Application No. 201880002872.8, and English translation thereof.
Japanese Office Action dated Jul. 7, 2020 in connection with Japanese Application No. 2019500526 and English translation thereof.

* cited by examiner

FIG. 7
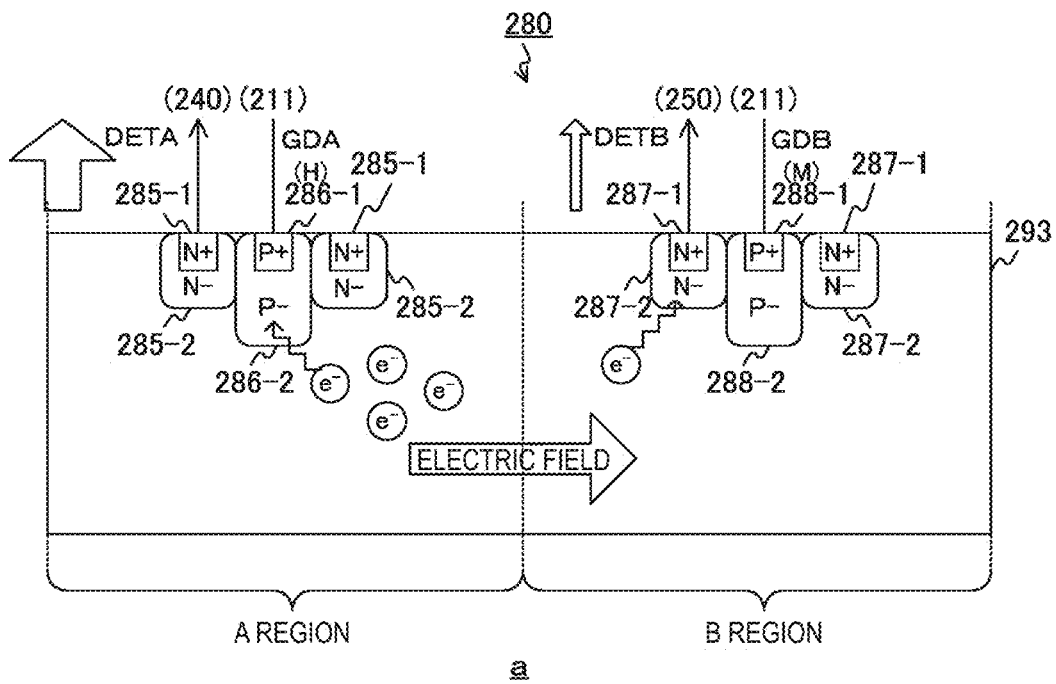
a
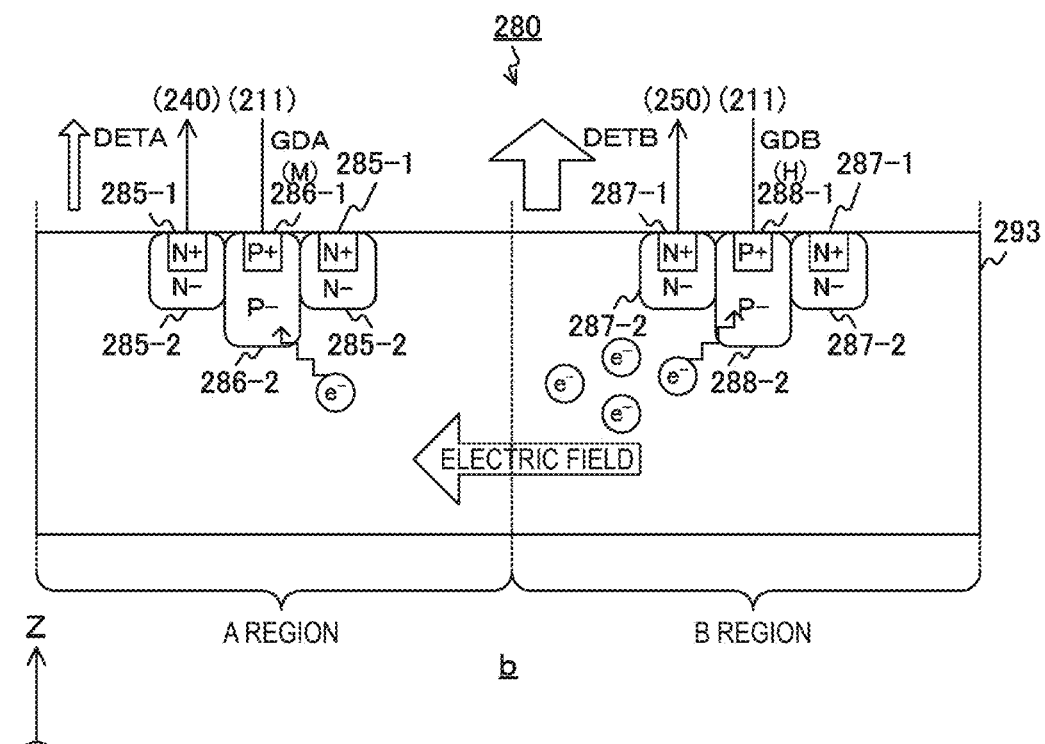
b

SOLID-STATE IMAGING DEVICE HAVING A PHOTOELECTRIC CONVERSION ELEMENT WITH MULTIPLE ELECTRODES

CROSS REFERENCE TO RELATED APPLICATIONS

This application is a National Stage of International Application No. PCT/JP2018/017929, filed in the Japanese Patent Office as a Receiving Office on May 9, 2018, which claims priority to Japanese Patent Application No. JP 2017-153751, filed in the Japanese Patent Office on Aug. 9, 2017, each of which is hereby incorporated by reference in its entirety.

TECHNICAL FIELD

The present technology relates to a solid-state imaging device, an electronic device, and a controlling method of a solid-state imaging device. Specifically, the technology relates to a solid-state imaging device, an electronic device, and a controlling method of a solid-state imaging device each of which finds a distance from a phase difference between irradiation light and reflection light.

BACKGROUND ART

In related art, a distance measurement method is known, referred to as a TOF (Time of Flight) way. The TOF way is a method in which intermittent light such as sinusoidal wave or rectangular wave is irradiated from an electronic device as irradiation light to find a phase difference between reflection light relative to the irradiation light, and the irradiation light, and the distance is measured from the phase difference. With respect to the electronic device employing the TOF way, a system applying a CAPD (Current Assisted Photonic Demodulator) method is proposed so as to improve distance measurement accuracy (for example, see Patent Literature 1). In this regard, the CAPD method is a method that, in a photodiode in which two electrodes and two detection terminals are provided, electric charges are transferred from one in the two detection terminals to the other such that a potential difference is provided to the electrodes. In the CAPD method, the electronic device finds a distance according to the phase difference by detecting a received light amount such that positive and negative of the potential difference are switched at timings in synchronization with the irradiation light.

CITATION LIST

Patent Literature

Patent Literature 1: JP 2011-86904 A

DISCLOSURE OF INVENTION

Technical Problem

In the above-described related art, the distance measurement accuracy can be improved by application of the CAPD method. In the CAPD method, as the transfer efficiency of the electric charges in the photodiode is enhanced, the distance measurement accuracy is improved, and thus a higher transfer efficiency is preferable. However, in a higher frequency of the irradiation light, a switching interval between positive and negative in potential is made shorter accordingly; the electric charges cannot be transferred completely by the time of the next switching, so that the transfer efficiency is lowered. In addition, when the light is incident on a lower portion of a transfer source of the two detection terminals, electric charges in which the light is converted are not transferred to a transfer terminal of a transfer destination, so that the transfer efficiency is lowered. In order to enhance the transfer efficiency, it is sufficient if an absolute value of the potential difference is increased; however, it is not preferable because of an increased power consumption. Thus, there is a problem that, in the above-described related art, it is difficult to enhance the transfer efficiency of the electric charges.

The present technology is produced in view of such situations, and in a device that transfer the electric charges in the photodiode, it is desirable to enhance the transfer efficiency of the electric charges.

Solution to Problem

The present technology has been devised to solve the problem described above, and a first aspect thereof is a solid-state imaging device including: a photoelectric conversion element provided with a plurality of electrodes and a plurality of detection terminals; a driver that generates at a same time in the photoelectric conversion element a plurality of electric fields having directions different from each other by supplying a potential to each of the plurality of electrodes so as to transfer electric charges from all of detection terminals not corresponding to a transfer destination out of the plurality of detection terminals to a detection terminal at the transfer destination; and a detection section that detects a signal corresponding to a total amount of the electric charges transferred to the detection terminal at the transfer destination, and a controlling method thereof. This provides an operation that the electric charges are transferred from all the detection terminals not corresponding to the transfer destination to the detection terminal at the transfer destination in the solid-state imaging device in which the plurality of electric fields having the different directions is generated.

In addition, according to this first aspect, a number of the plurality of electrodes may be 4, a number of the plurality of detection terminals may be 4, the detection section may include 4 detection circuits connected to the detection terminals different from each other, and the plurality of electrodes may be arrayed in a two-dimensional lattice shape. This provides an operation that the electric charges are transferred from 3 detection terminals not corresponding to the transfer destinations to the detection terminals at the transfer destinations.

In addition, according to this first aspect, the driver may supply a high potential higher than a predetermined potential to the electrode adjacent to the detection terminal at the transfer source out of the plurality of electrodes, supply the predetermined potential to the electrode adjacent to each of two detection terminals in which a distance to the transfer source is same, out of the detection terminals not corresponding to the transfer source, and supply a low potential lower than the predetermined potential to a remaining electrode. This provides an operation that the electric charges are transferred by the plurality of electric fields generated by the high potential, the two predetermined potentials and the single low potential.

In addition, according to this first aspect, the driver may supply a high potential higher than a predetermined potential to the electrode adjacent to the terminal at the transfer source out of the plurality of electrodes, supply a low potential lower than the predetermined potential to the electrode adjacent to each of two detection terminal in which a distance to the transfer source is same, out of the detection terminals not corresponding to the transfer source, and supply the predetermined potential to a remaining electrode. This provides an operation that the electric charges are transferred by the plurality of electric fields generated by the high potential, the single predetermined potentials and the two low potentials.

In addition, according to this first aspect, the driver may supply a high potential higher than a predetermined potential to the electrode adjacent to the detection terminal at the transfer source out of the plurality of electrodes, supply a first low potential lower than the predetermined potential to the electrode adjacent to one of two detection terminals in which a distance to the transfer source is same, out of the detection terminals not corresponding to the transfer source, supply a second low potential lower than the second low potential to the electrode adjacent to another of the two detection terminals, and supply the predetermined potential to a remaining electrode. This provides an operation that the electric charges are transferred by the plurality of electric fields generated by the high potential, the predetermined potential, the first low potential and the second low potential.

In addition, according to this first aspect, the driver may supply a high potential higher than a predetermined potential to the electrode adjacent to the detection terminal at the transfer source out of the plurality of electrodes, and supply a low potential lower than the predetermined potential to a remaining electrode. This provides an operation that the electric charges are transferred by the plurality of electric fields generated by the high potential and the low potential.

In addition, according to this first aspect, a number of the plurality of electrodes may be 3, a number of the plurality of detection terminals may be 3, the detection section may include 3 detection circuits connected to the detection terminals different from each other. This provides an operation that the electric charges are transferred from 2 detection terminals not corresponding to the transfer destination to the detection terminal at the transfer destination.

In addition, according to this first aspect, a number of the plurality of electrodes may be 5, a number of the plurality of detection terminals may be 5, the detection section may include 5 detection circuits connected to the detection terminals different from each other. This provides an operation that the electric charges are transferred from 4 detection terminals not corresponding to the transfer destination to the detection terminal at the transfer destination.

In addition, according to this first aspect, a light shielding section that shields light from an element adjacent to the photoelectric conversion element to the photoelectric conversion element may be further included. This provides an operation that isolation between the photoelectric conversion elements is achieved.

In addition, according to this first aspect, a shape of each of the plurality of electrodes and the plurality of detection terminals may be a circle. This provides an operation that the electric charges are transferred between circular detection terminals.

In addition, according to this first aspect, a shape of each of the plurality of electrodes and the plurality of detection terminals may be a rectangle. This provides an operation that the electric charges are transferred between rectangular detection terminals.

In addition, a second aspect of the present technology is an electronic device including: a photoelectric conversion element provided with a plurality of electrodes and a plurality of detection terminals; a driver that generates at a same time in the photoelectric conversion element a plurality of electric fields having directions different from each other by supplying a potential to each of the plurality of electrodes so as to transfer electric charges from all of detection terminals not corresponding to a transfer destination out of the plurality of detection terminals to a detection terminal at the transfer destination; a detection section that detects a signal corresponding to a total amount of the electric charges transferred to the detection terminal at the transfer destination; and a distance measuring section that measures a distance to a predetermined object on a basis of the signal. This provides an operation that the distance is measured on the basis of the signal corresponding to the amount of the electric charges.

Advantageous Effects of Invention

According to the present technology, an excellent effect can be achieved that in the device that transfers the electric charges in the photodiode, the transfer efficiency of the electric charges can be enhanced. Note that the effects described herein are not necessarily limitative and may refer to any one of the effects described in this specification.

BRIEF DESCRIPTION OF DRAWINGS

FIG. 7 is a view for illustrating a condition of the photodiode during driving in the first embodiment of the present technology.

MODE(S) FOR CARRYING OUT THE INVENTION

Hereinafter, forms for implementing the present technology (hereinafter, referred to as embodiments) will be described. The description will be made in the following order.

Figure 1:
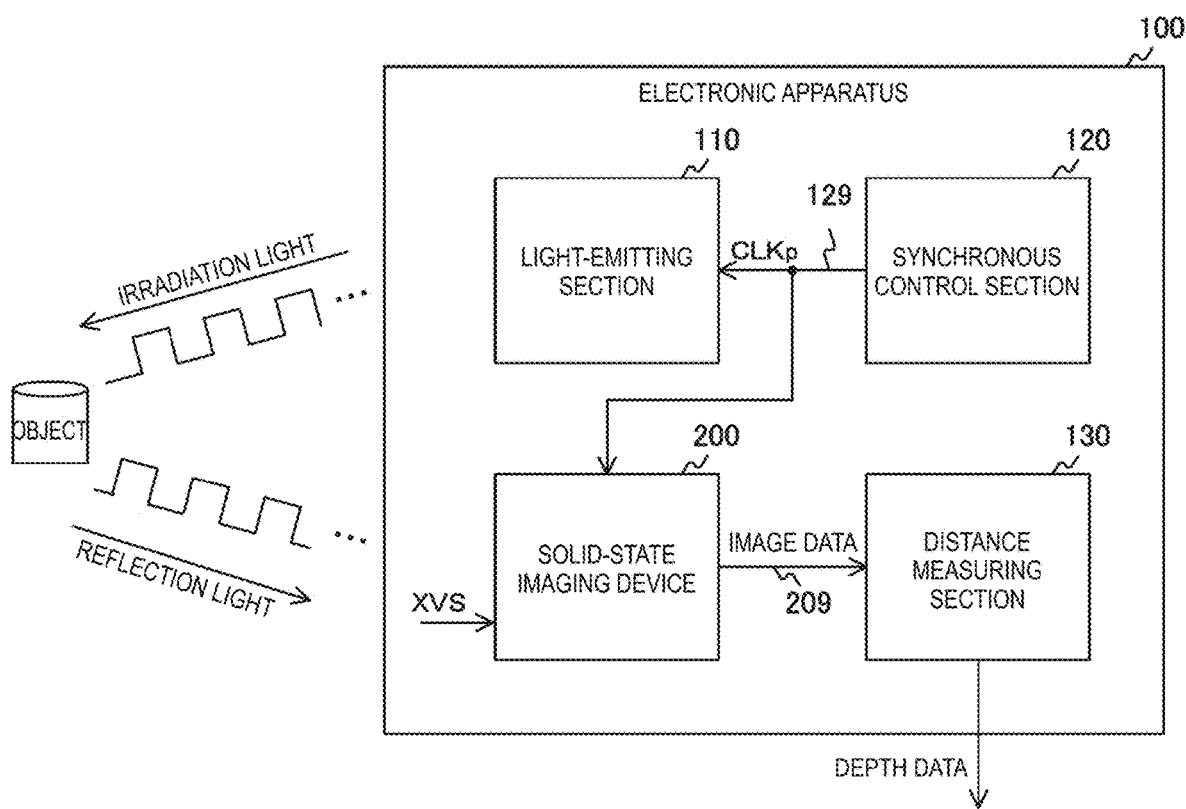
FIG. 1 is a block diagram depicting a configuration example of an electronic device in a first embodiment of the present technology.

1. First Embodiment (Example provided with 4 taps to generate a plurality of electric fields)
2. Second Embodiment (Example provided with 3 taps to generate a plurality of electric fields)
3. Third Embodiment (Example provided with 5 taps to generate a plurality of electric fields)
4. Fourth Embodiment (Example provided with a light shielding section to generate a plurality of electric fields)
5. Fifth Embodiment (Example by two types of potentials to generate a plurality of electric fields)
6. Sixth Embodiment (Example by three types of potentials to generate a plurality of electric fields)
7. Seventh Embodiment (Example by four types of potentials to generate a plurality of electric fields)
8. Example of Application to mobile object 1. First Embodiment Configuration Example of Electronic Device FIG. 1 is a block diagram depicting a configuration example of an electronic device 100 in an embodiment of the present technology. The electronic device 100 is a device capable of measuring a distance to an object by a TOF way, and includes a light-emitting section 110, a synchronous control section 120, a solid-state imaging device 200 and a distance measuring section 130.

The light-emitting section 110 is configured to make irradiation with intermittent light in synchronization with a synchronizing signal having a predetermined frequency. For example, near-infrared light, for example, is used as irradiation light. In addition, a clock signal CLKp of rectangular waves is used as the synchronizing signal. Note that a signal of sinusoidal waves can also be used as the synchronizing signal.

The solid-state imaging device 200 is configured to receive reflection light with respect to the intermittent light and generate light reception data. The solid-state imaging device 200 generates image data including a predetermined number of light reception data in synchronization with a vertical synchronizing signal XVS, and supplies the data to the distance measuring section 130 via a signal line 209. The frequency of the vertical synchronizing signal XVS is, for example, 30 hertz (Hz).

The synchronous control section 120 is configured to operate the light-emitting section 110 and the solid-state imaging device 200 synchronously. The synchronous control section 120 supplies the clock signal CLKp to the light-emitting section 110 and the solid-state imaging device via a signal line 129. The frequency of the clock signal CLKp is higher than that of the vertical synchronizing signal, and is, for example, 10 to 20 megahertz (MHz).

The distance measuring section 130 is configured to measure the distance reaching the object on the basis of the image data. The distance measuring section generates depth data representing measured values and outputs the data to the external. The depth data is used for, for example, image processing or gesture recognition that performs blurring processing of a degree corresponding to a distance.

Configuration Example of Solid-State Imaging Device

Figure 2:
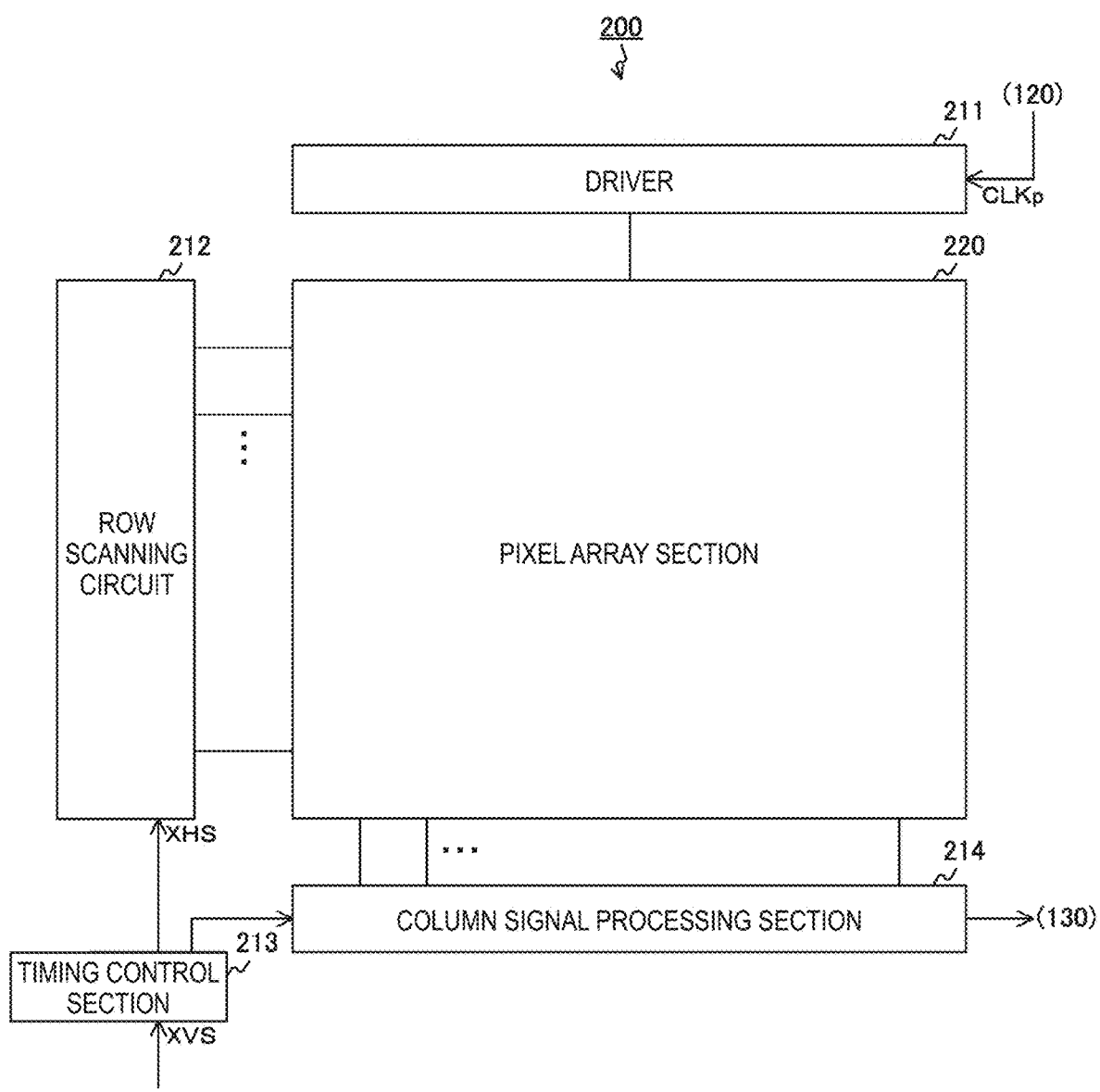
FIG. 2 is a block diagram depicting a configuration example of a solid-state imaging device in the first embodiment of the present technology.

FIG. 2 is a block diagram depicting a configuration example of the solid-state imaging device 200 in a first embodiment of the present technology. The solid-state imaging device 200 includes a driver 211, a row scanning circuit 212, a pixel array section 220, a timing control section 213 and a column signal processing section 214.

The driver 211 is configured to supply to the pixel array section 220 a plurality of drive signals different in phase from each other in synchronization with the clock signal CLKp from the synchronous control section 120. The details of the drive signals will be described later.

A plurality of pixels is arrayed in the solid-state imaging device 200 in a two-dimensional lattice shape. Hereinafter, in the solid-state imaging device 200, a group of the pixels arrayed in a predetermined direction (horizontal direction and so on) are referred to as "row," and a group of the pixels arrayed perpendicular to the row are referred to as "column."

The timing control section 213 is configured to control operation timings of the row scanning circuit 212 and the column signal processing section 214 in synchronization with the vertical synchronizing signal XVS. The timing control section 213 generates a horizontal synchronizing signal XHS having a higher frequency than that of the vertical synchronizing signal XVS, and supplies the signal to the row scanning circuit 212.

The row scanning circuit 212 is configured to drive sequentially the rows in synchronization with the vertical synchronizing signal XVS. The column signal processing section 214 is configured to carry out, for each column, predetermined signal processing such as AD (Analog-to-Digital) conversion processing or CDS (Correlated Double Sampling) processing with respect to a pixel signal from a pixel. The column signal processing section 214 supplies image data including data after processing to the distance measuring section 130.

Figure 3:
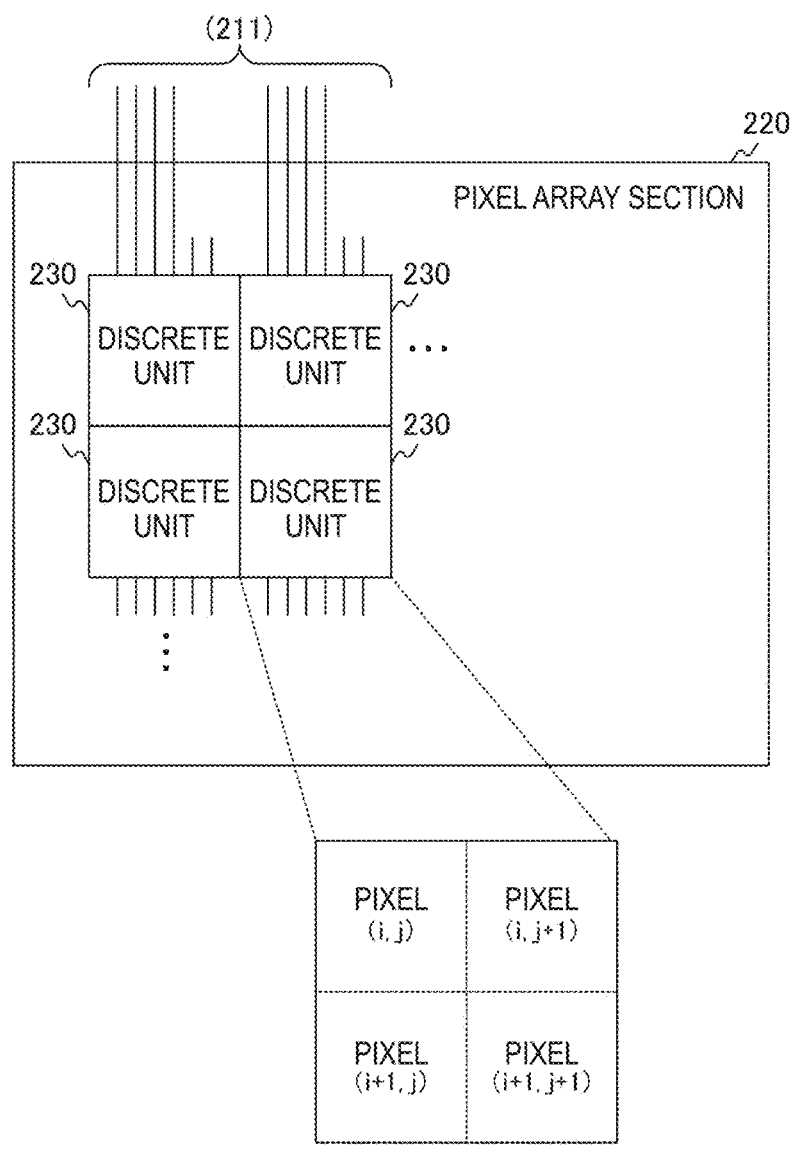
FIG. 3 is a plan view of a pixel array section in the first embodiment of the present technology.

FIG. 3 is a plan view of the pixel array section 220 in the first embodiment of the present technology. In the pixel array section 220, a plurality of discrete units 230 is arranged in a two-dimensional lattice shape. 4 pixels in 2 rows and 2 columns are arrayed in each of the discrete units 230.

In the discrete unit 230, a coordinate of an upper-left pixel is, for example, (i, j), where i and j each are an integer. In addition, a coordinate of an upper-right pixel is (i, j+1), and a coordinate of a lower-left pixel is (i+1, j). A coordinate of a lower-right pixel is (i+1, j+1).

In addition, 4 drive signal lines for transmitting the drive signal from the driver 211 are arranged for each column of the discrete unit 230. Furthermore, a vertical signal line is arranged for each column of the pixels.

Configuration Example of Solid-State Imaging Device

Figure 4:
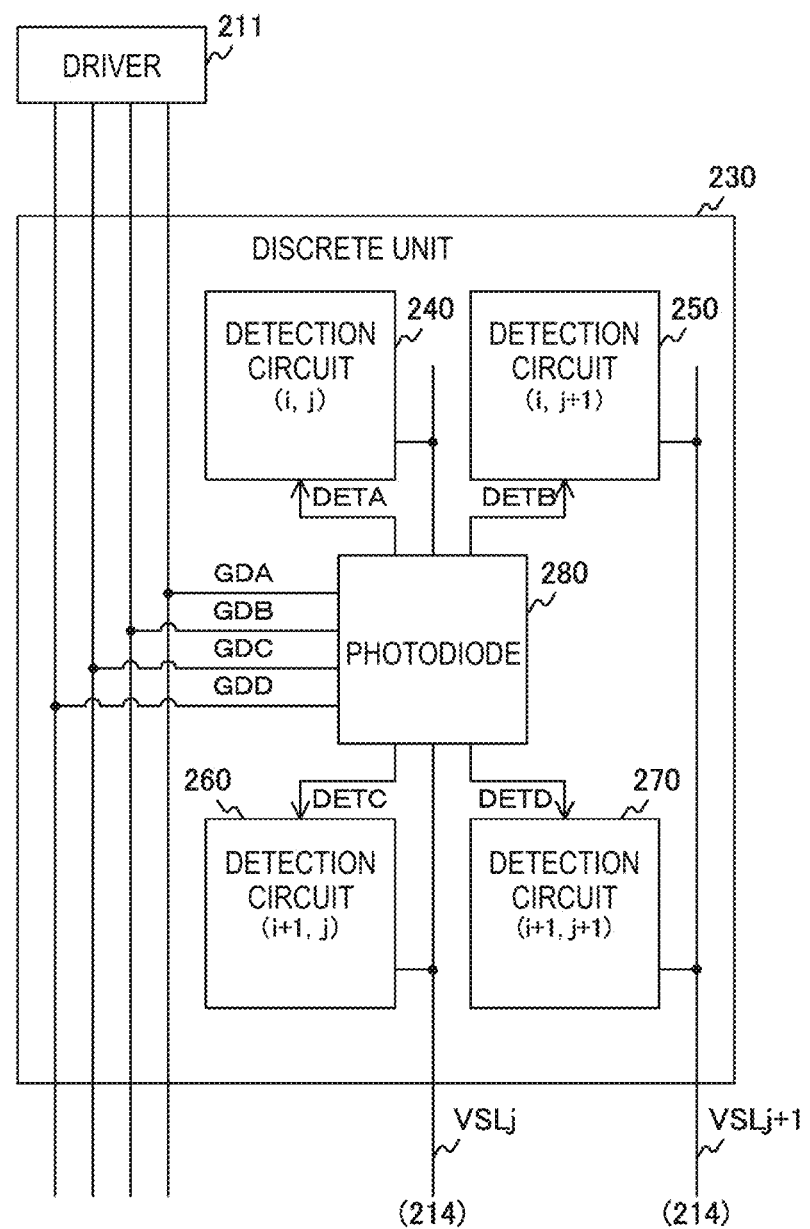
FIG. 4 is a block diagram depicting a configuration example of a discrete unit in the first embodiment of the present technology.

FIG. 4 is a block diagram depicting one configuration example of the discrete unit 230 in the first embodiment of the present technology. The discrete unit 230 includes detection circuits 240, 250, 260 and 270, and a photodiode 280.

The photodiode 280 is configured to convert incident light to electric charges by photoelectric conversion. Drive signals GDA, GDB, GDC and GDD from the driver 211 are inputted in the photodiode 280 via the drive signal line. Respective phases of the drive signals GDA, GDB, GDC and GDD are different from each other by 90 degrees.

The photodiode 280 outputs a current signal DETA to the detection circuit 240 when the drive signal GDA is at high level, and outputs a current signal DETB to the detection circuit 250 when the drive signal GDB is at high level. Also, the photodiode 280 outputs a current signal DETC to the detection circuit 260 when the drive signal GDC is at high level, and outputs a current signal DETD to the detection circuit 270 when the drive signal GDD is at high level.

The detection circuit 240 is configured to detect a pixel signal of a voltage corresponding to the current signal DETA, and output the signal to the column signal processing section 214 via a vertical signal line $VSL_j$. The detection circuit 250 is configured to detect a pixel signal of a voltage corresponding to the current signal DETB, and output the signal to the column signal processing section 214 via a vertical signal line $VSL_{j+1}$.

The detection circuit 260 is configured to detect a pixel signal of a voltage corresponding to the current signal DETC, and output the signal to the column signal processing section 214 via a vertical signal line $VSL_j$. The detection circuit 270 is configured to detect a pixel signal of a voltage corresponding to the current signal DETD, and output the signal to the column signal processing section 214 via the vertical signal line $VSL_{j+1}$.

A circuit including the detection circuit 240 and the photodiode 280 in FIG. 4 corresponds to the pixel at the coordinate (i, j) in FIG. 3. Also, a circuit including the detection circuit 250 and the photodiode 280 in FIG. 4 corresponds to the pixel at the coordinate (i, j+1) in FIG. 3. Also, a circuit including the detection circuit 260 and the photodiode 280 in FIG. 4 corresponds to the pixel at the coordinate (i+1, j) in FIG. 3. Also, a circuit including the detection circuit 270 and the photodiode 280 in FIG. 4 corresponds to the pixel at the coordinate (i+1, j+1) in FIG. 3. That is, the photodiode 280 is shared by 4 pixels.

Note that the circuit including the detection circuits 240, 250, 260 and 270 is an example of detection sections as recited in the scope of claims.

Configuration Example of Photodiode

Figure 5:
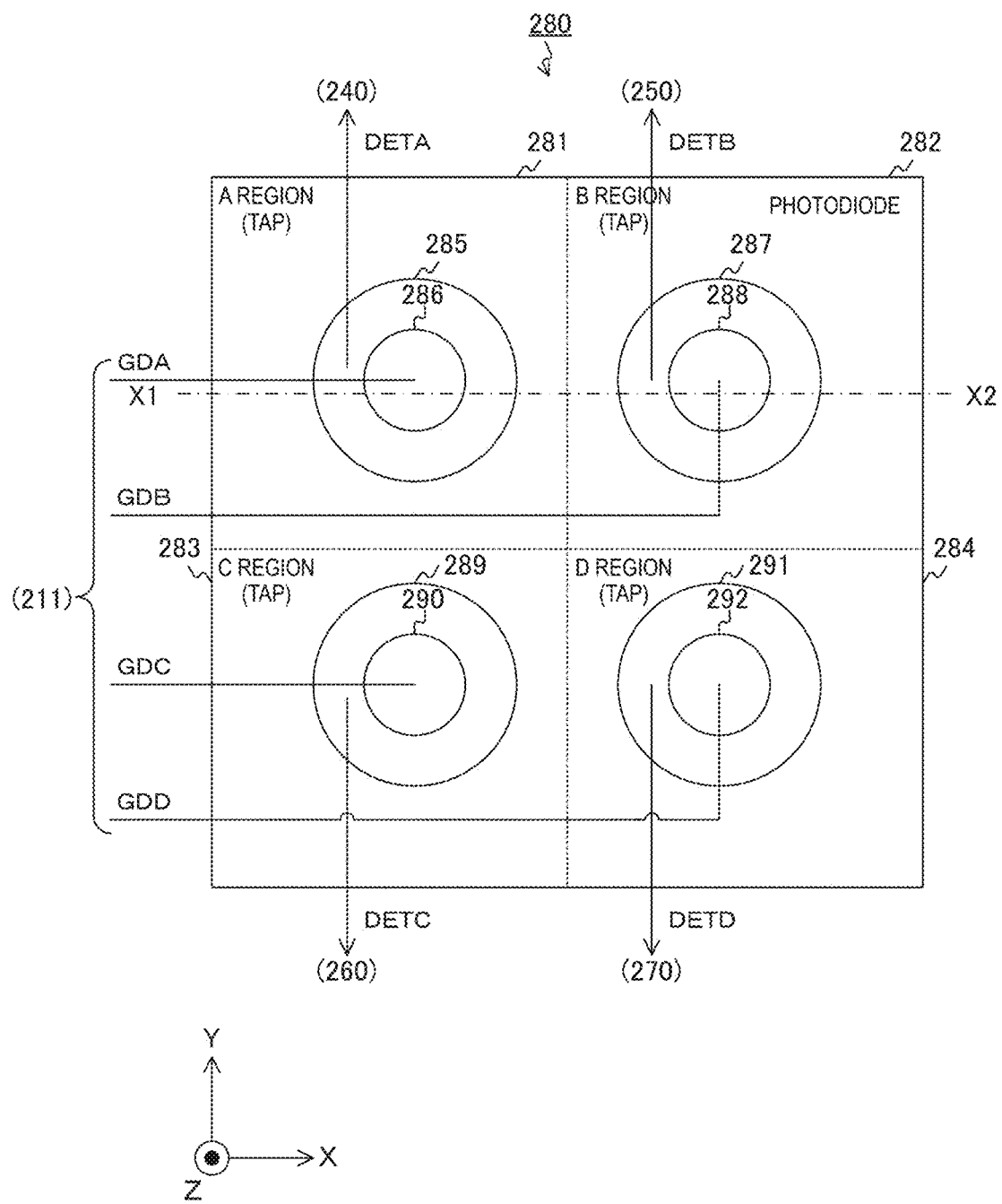
FIG. 5 is a plan view from a wiring surface side of a photodiode in the first embodiment of the present technology.

FIG. 5 is a plan view from a wiring surface side of the photodiode 280 in the first embodiment of the present technology. In this case, a direction of the row is denoted as an X direction, a direction of the column is denoted as a Y direction, and a direction perpendicular to the X direction and the Y direction is denoted as a Z direction. An XY plane of the photodiode 280 is divided into an A region 281, a B region 282, a C region 283 and a D region 284. Then, these 4 regions are arrayed in 2 rows and 2 columns. In addition, each of these regions is also referred to as "tap." That is, the photodiode 280 includes 4 taps.

A detection terminal 285 and an electrode 286 adjacent to the detection terminal 285 is arranged in the A region 281. A detection terminal 287 and an electrode 288 adjacent to the detection terminal 287 are arranged in the B region 282. Also, a detection terminal 289 and an electrode 290 adjacent to the detection terminal 289 is arranged in the C region 283. A detection terminal 291 and an electrode 292 adjacent to the detection terminal 291 is arranged in the D region 284.

The shape of each of the detection terminals 285, 287, 289 and 291 is, for example, a circle when viewed from a direction (Z direction) perpendicular to a light receiving surface, and the shape of each of the electrodes 286, 288, 290 and 292 is also a circle. In addition, each of the detection terminals 285, 287, 289 and 291 is formed to surround the corresponding electrode.

In addition, the detection terminal 285 is connected to the detection circuit 240, and the detection terminal 287 is connected to the detection circuit 250. The detection terminal 289 is connected to the detection circuit 260, and the detection terminal 291 is connected to the detection circuit 270. The electrodes 286, 288, 290 and 292 are connected to the driver 211 via the drive signal lines different from each other. Then, the drive signals GDA, GDB, GDC and GDD are inputted to the electrodes 286, 288, 290 and 292, respectively. Note that the photodiode 280 is an example of photoelectric elements as recited in the scope of claims.

The driver 211 generates in the photodiode 280 a plurality of electric fields having different directions from each other by the drive signals GDA, GDB, GDC and GDD. For any of the detection terminals 285, 287, 289 and 291 as a transfer destination, the electric charges are transferred by these electric fields from all of the terminals not corresponding to the transfer destination, to the terminal at the transfer destination.

Figure 6:
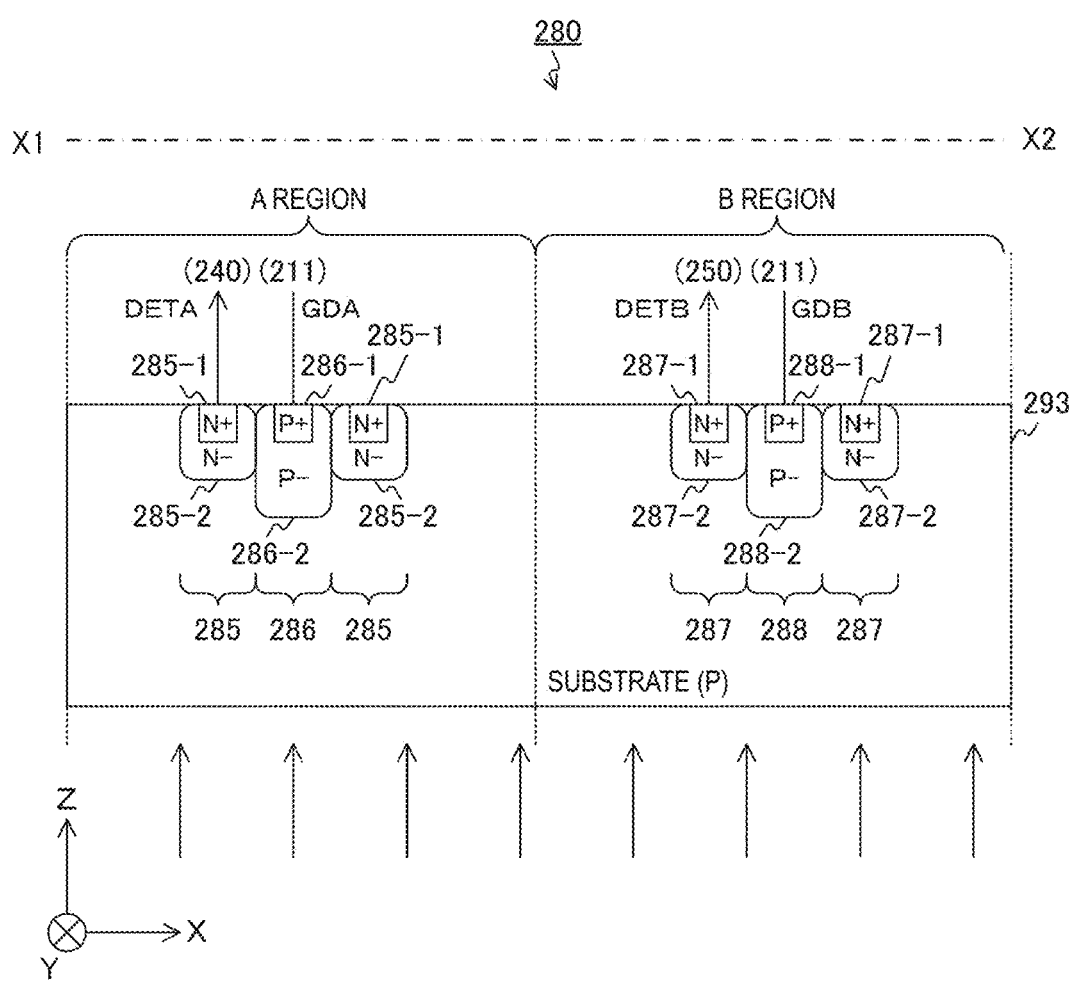
FIG. 6 is an example of cross-sectional views of the photodiode in the first embodiment of the present technology.

FIG. 6 is an example of cross-sectional views of the photodiode 280 in the first embodiment of the present technology. FIG. 6 corresponds to a cross-sectional view when the photodiode 280 is taken along a line segment X1-X2 in FIG. 5. In a substrate 293 of the photodiode 280, a lower surface in FIG. 6 corresponds to a light receiving surface. The detection terminals 285 and 287 and the electrodes 286 and 288 are formed on an upper wiring surface opposing the light receiving surface. In addition, arrows in FIG. 6 show an incident direction of light.

The detection terminal 285 includes an $N^-$ layer 285-2 and an $N^+$ layer 285-1 at its upper side. The electrode 286 includes a $P^-$ layer 286-2 and a $P^+$ layer 286-1 at its upper side. The detection terminal 287 includes an $N^-$ layer 287-2 and an $N^+$ layer 287-1 at its upper side. The electrode 288 includes a $P^-$ layer 288-2 and a $P^+$ layer 288-1 at its upper side. The substrate 293 is adapted to include a P-type semiconductor.

As noted above, with respect to the wiring surface of the substrate 293 as a front surface, light is irradiated to a rear surface opposing the front surface. This type of solid-state imaging device 200 is called a backside illumination type solid-state imaging device.

FIG. 7 is a view for illustrating a condition of the photodiode 280 during driving in the first embodiment of the present technology. A letter 'a' in FIG. 7 is a view for illustrating the condition of the photodiode 280 when an electric field from the A region to the B region is generated. A letter 'b' in FIG. 7 is a view for illustrating the condition of the photodiode 280 when an electric field from the B region to the A region is generated.

As illustrated in the letter 'a' in FIG. 7, when the driver 211 supplies a potential at a high level higher than a middle level to the electrode 286, and supplies the potential at a middle level to the electrode 288, the electric field directed from the A region to the B region is generated. By the electric field, the minus electric charges (electrons) are drifted, and most of them is transferred from the B region to the A region. The electric charges are outputted from the detection terminal 285, and the current signal DETA flows. In addition, a slight leakage current flows at the detection terminal 287.

On the other hand, as illustrated in the letter 'b' in FIG. 7, when the driver 211 supplies the potential at the middle level to the electrode 286, and supplies the potential at the high level to the electrode 288, the electric field directed from the B region to the A region is generated. By the electric field, the electrons are drifted, and most of them is transferred from the A region to the B region. The electric charges are outputted from the detection terminal 287, and the current signal DETB flows. In addition, a slight leakage current flows at the detection terminal 285.

Thus, the following method is called a CAPD method: the electric charges are transferred between the plurality of detection terminals by provision of a potential difference between the plurality of electrodes in the photodiode. In a general CAPD method, only the two electrodes are provided in the photodiode, and the electric charges are transferred from one in the electrodes to the other. In contrast, the 4 electrodes 286, 288, 290 and 292 are provided in the photodiode 280, and the electric charges are transferred from 3 electrodes out of them to the remaining 1 electrode.

Figure 8:
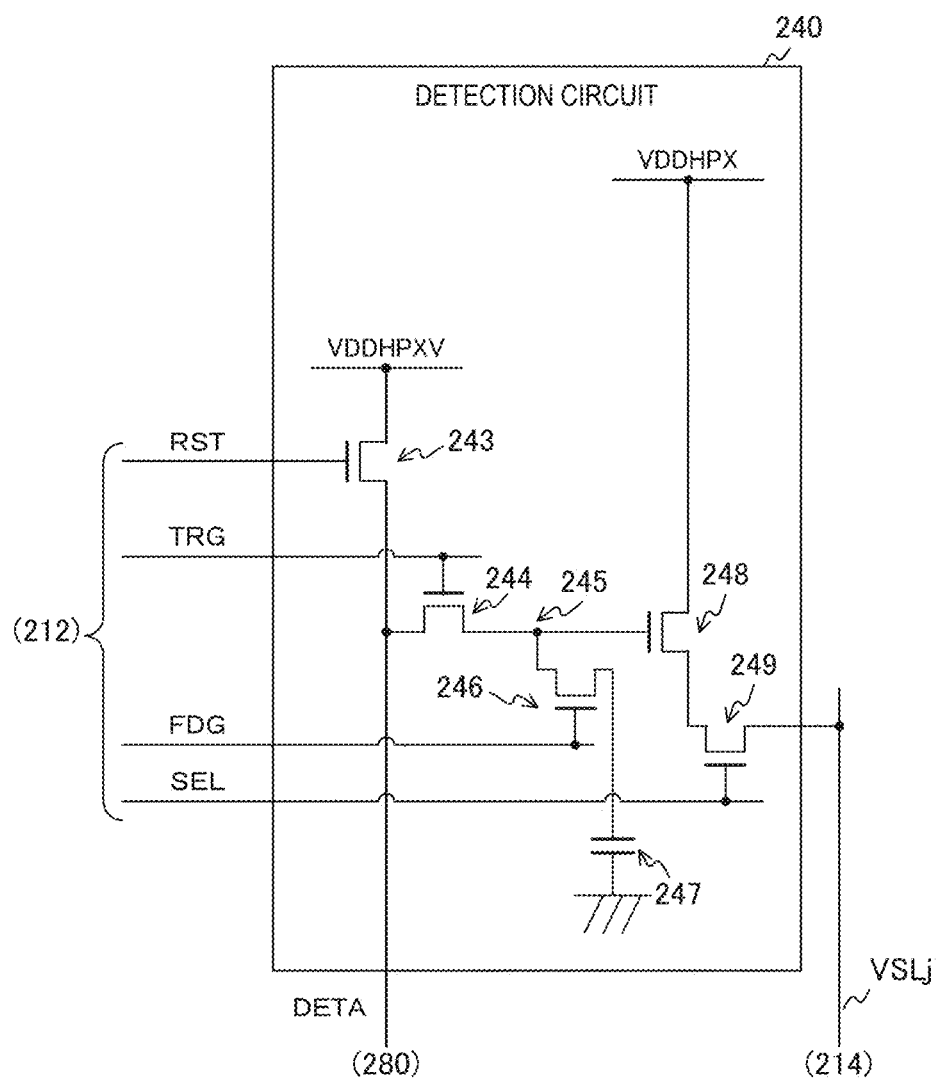
FIG. 8 is a circuit diagram depicting a configuration example of an upper-left detection circuit in the first embodiment of the present technology.

FIG. 8 is a circuit diagram depicting a configuration example of the upper-left detection circuit 240 in the first embodiment of the present technology. The upper-left detection circuit 240 includes a reset transistor 243, a transfer transistor 244, a floating diffusion layer 245, a gain control transistor 246, a capacitance 247, an amplification transistor 248 and a selection transistor 249. An N type MOS transistor (Metal-Oxide-Semiconductor), for example, is employed for the transistor of the reset transistor 243 or the like.

The reset transistor 243 is configured to initialize the pixel according to a reset signal RST from the row scanning circuit 212.

The transfer transistor 244 is configured to transfer the electric charges from the photodiode 280 to the floating diffusion layer 245 according to a transfer signal TRG from the row scanning circuit 212. The floating diffusion layer 245 is configured to store transferred electric charges and generate a voltage corresponding to the total amount of electric charges stored.

The gain control transistor 246 is configured to control the gain of the detection circuit 240 by transferring the electric charges from the floating diffusion layer 245 to the capacitance 247 according to a control signal FDG from the row scanning circuit 212.

The amplification transistor 248 is configured to amplify the signal of the voltage in the floating diffusion layer 245. The selection transistor 249 is configured to output as the pixel signal the signal amplified by the amplification transistor 248 to the vertical signal line $VSL_j$ according to a selection signal SEL from the row scanning circuit 212.

Figure 9:
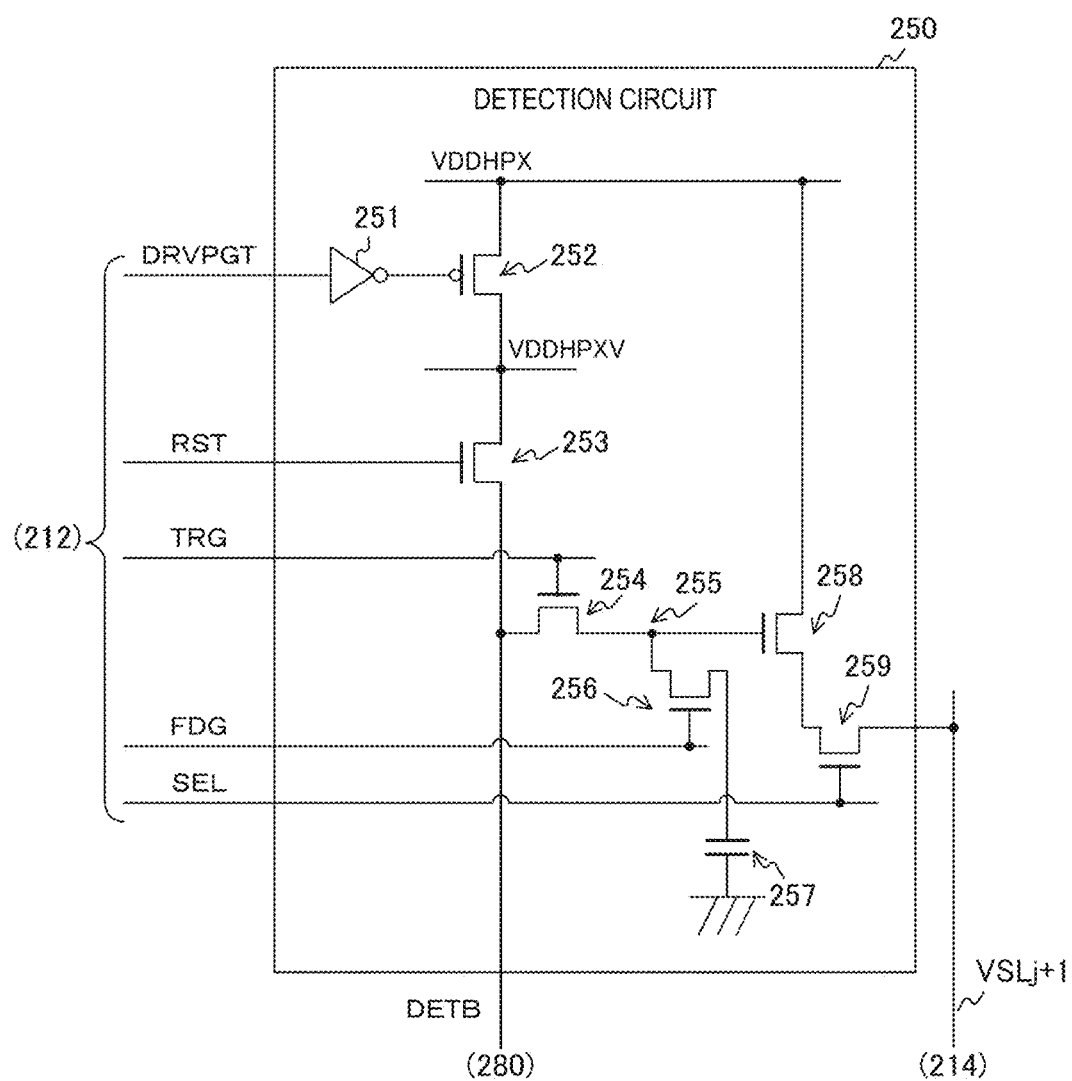
FIG. 9 is a circuit diagram depicting a configuration example of an upper-right detection circuit in the first embodiment of the present technology.

FIG. 9 is a circuit diagram depicting a configuration example of the upper-right detection circuit 250 in the first embodiment of the present technology. The upper-left detection circuit 250 includes an inverter 251 and a power supply control transistor 252. In addition, the upper-left detection circuit 250 includes a reset transistor 253, a transfer transistor 254, a floating diffusion layer 255, a gain control transistor 256, a capacitance 257, an amplification transistor 258 and a selection transistor 259. Functions of the elements other than the inverter 251 and the power supply control transistor 252 are the same as those of the same names in the detection circuit 240. In addition, a P type MOS transistor, for example, is employed for the power supply control transistor 252.

The inverter 251 is configured to invert a control signal DRVPGT from the row scanning circuit 212 and supply the resultant to a gate of the power supply control transistor 252.

The power supply control transistor 252 is configured to supply any of power supplies VDDHPX and VDDHPXV as a reset power supply according to a signal from the invertor 251. The configurations of the detection circuits 260 and 270 are similar to those of the detection circuits 240 and 250.

Figure 10:
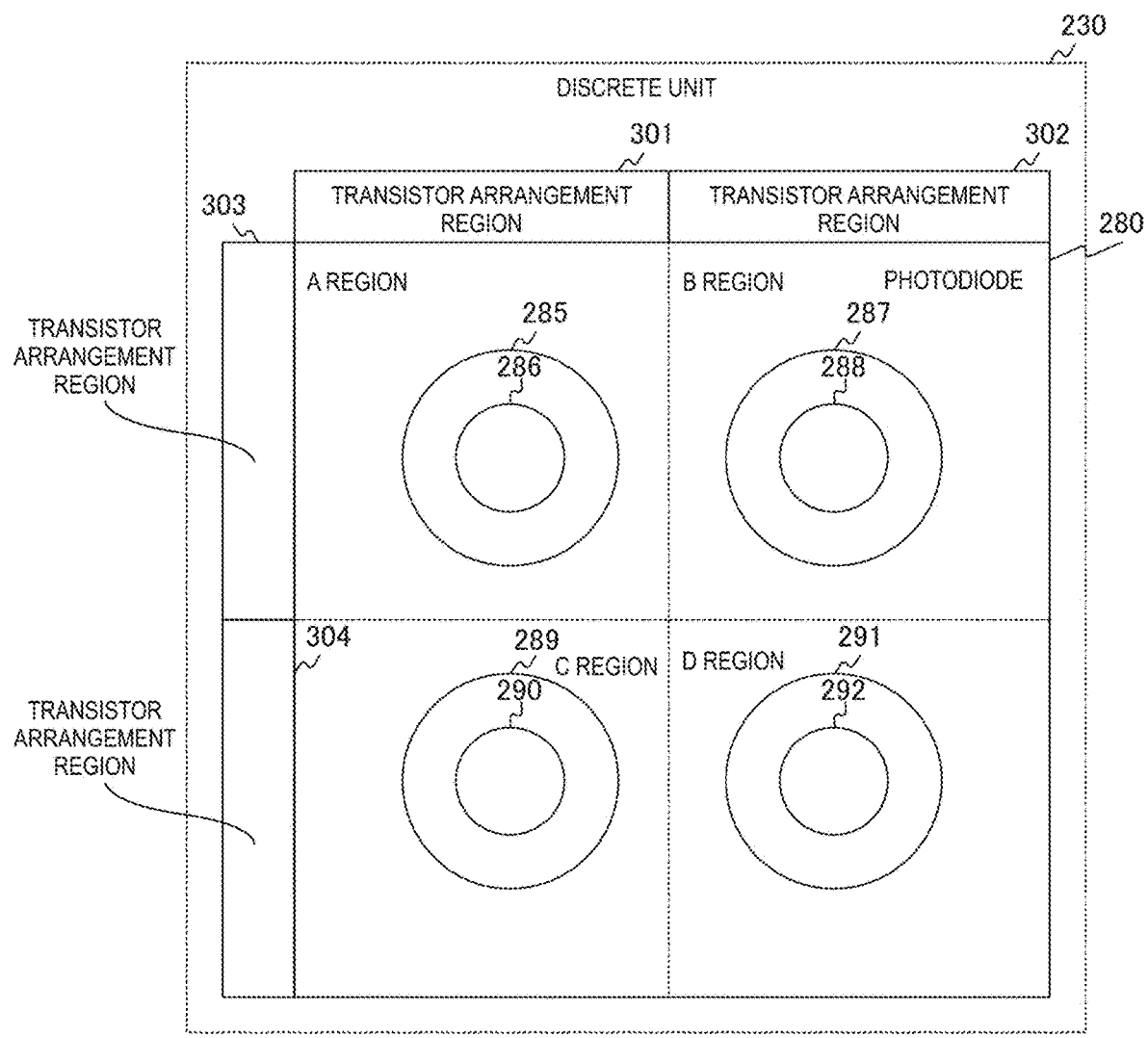
FIG. 10 is an example of plan views of a discrete unit in the first embodiment of the present technology.

FIG. 10 is an example of plan views of the discrete unit 230 in the first embodiment of the present technology. Transistor arrangement regions 301 and 302 are arrayed adjacent to the photodiode 280 along a row direction. In addition, transistor arrangement regions 303 and 304 are arrayed adjacent to the photodiode 280 along a column direction.

For example, a group of transistors in the detection circuit 240 are arrayed along the row direction in the transistor arrangement region 301, and for example, a group of transistors in the detection circuit 250 are arrayed along the row direction in the transistor arrangement region 302. In addition, for example, a group of transistors in the detection circuit 260 are arrayed along the column direction in the transistor arrangement regions 303, and for example, a group of transistors in the detection circuit 270 are arrayed along the column direction in the transistor arrangement region 304.

Figure 11:
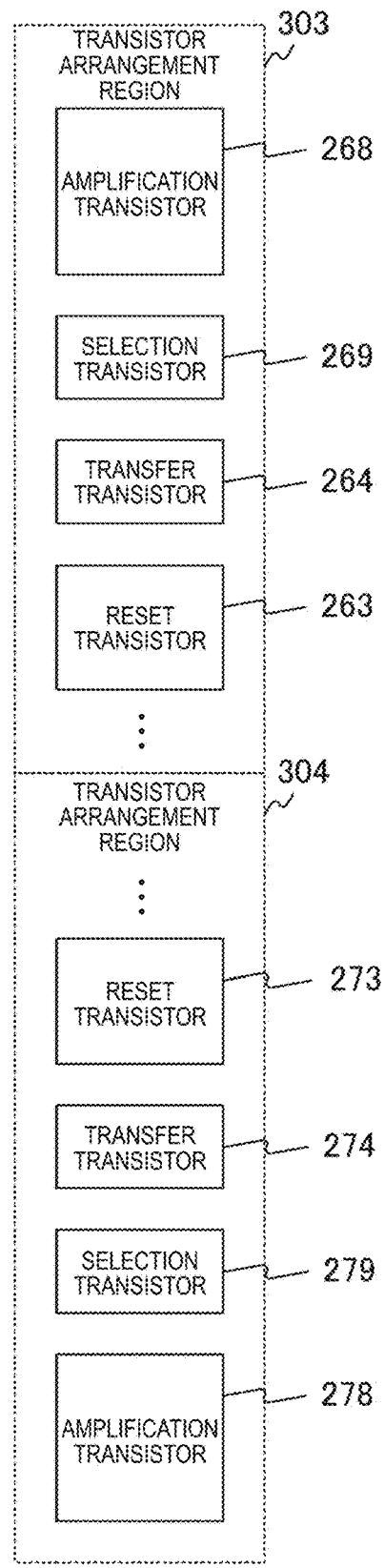
FIG. 11 is a circuit diagram depicting a configuration example of transistor arrangement regions in the first embodiment of the present technology.

FIG. 11 is a circuit diagram depicting a configuration example of the transistor arrangement regions 303 and 304 in the first embodiment of the present technology. For example, an amplification transistor 268, a selection transistor 269, a transfer transistor 264 and a reset transistor 363 are arrayed in a column direction in the transistor arrangement region 303. In addition, a reset transistor 273, a transfer transistor 274, a selection transistor 279 and an amplification transistor 278 and the like are arrayed in the column direction in the transistor arrangement region 304.

Figure 12:
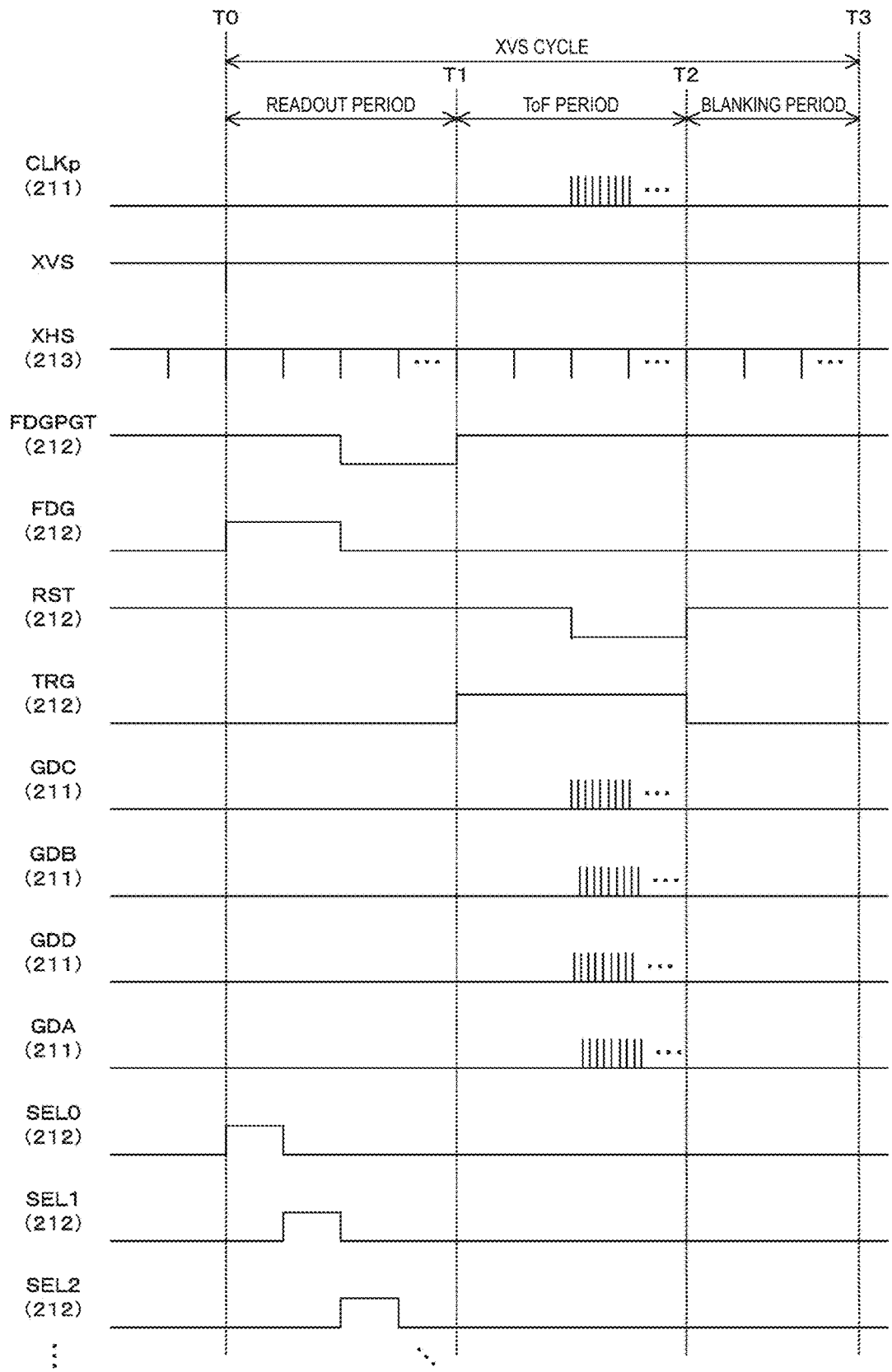
FIG. 12 is a timing chart depicting an example of operations of the solid-state imaging device in the first embodiment of the present technology.

FIG. 12 is a timing chart depicting an example of operations of the solid-state imaging device 200 in the first embodiment of the present technology. In a readout period from a start timing T0 in a cycle of a horizontal synchronizing signal XVS to a subsequent timing T1, the row scanning circuit 212 supplies a control signal FDGPGT and a control signal FDG at a high level in a certain duration. In addition, the row scanning circuit 212 supplies a reset signal RST at the high level over the readout period. Furthermore, the row scanning circuit 212 supplies sequentially selection signals SEL0 to SELN at the high levels in synchronization with a horizontal synchronizing signal XHS. In this way, N rows are read out sequentially.

In a TOF period from the timing T1 at the end of the readout period to a subsequent timing T2, the row scanning circuit 212 supplies the control signal FDGPGT at the high level. In addition, the row scanning circuit 212 sets the reset signal RST to the low level at a predetermined timing. Furthermore, the row scanning circuit 212 supplies a transfer signal TRG at the high level to all rows. In this way, all the rows are driven at the same time. A method that drives all the rows at the same time in this manner is called a global shutter method.

In a blanking period from the timing T2 at the end of the TOF period to a subsequent timing T3, the row scanning circuit 212 supplies the control signal FDGPGT and the reset signal RST at the high level.

Figure 13:
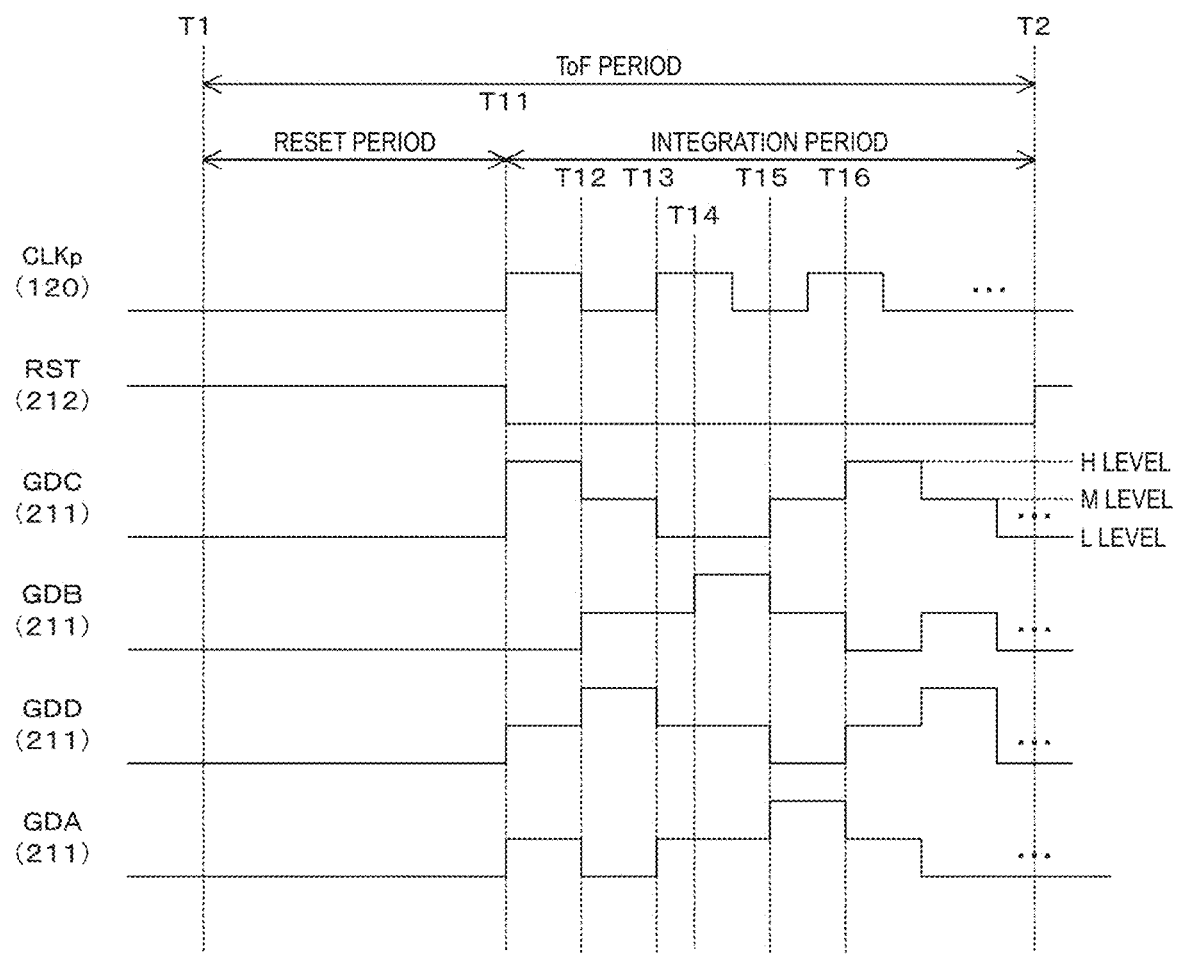
FIG. 13 is a timing chart depicting an example of operations of the solid-state imaging device in a TOF period in the first embodiment of the present technology.

FIG. 13 is a timing chart depicting an example of operations of the solid-state imaging device in the TOF period in the first embodiment of the present technology. In a reset period from the timing T1 at the start of the TOF period to a subsequent timing T11, the row scanning circuit 212 supplies the reset signal RST at the high level.

In an integration period from the timing T11 at the end of the reset period to the subsequent timing T2, the driver 211 supplies the drive signal in synchronization with the clock signal CLKp. Hereinafter, in the cycle of the clock signal CLKp, a phase at a rising of the clock signal CLKp (that is, at a light-emitting start of irradiation light) is set to 0 degrees. In a period of 0 degrees to 180 degrees, the driver 211 sets the drive signal GDC to the high level, sets the drive signal GDB to the low level, and sets the drive signals GDD and GDA to the middle level. In this way, the detection circuit 260 can detect a pixel signal representing a received light amount in the period of 0 degrees to 180 degrees. In this regard, the high level is a potential higher than that at the middle level, and the middle level is a potential higher than that at the low level. For example, a period of the timing T11 to a timing T12 corresponds to the period of 0 degrees to 180 degrees.

Also, in a period of 180 degrees to 360 degrees, the driver 211 sets the drive signals GDC and GDB to the middle level, sets the drive signal GDD to the high level, and sets the drive signal GDA to the low level. In this way, the detection circuit 270 can detect a pixel signal representing the received light amount in the period of 180 degrees to 360 degrees. For example, a period of the timing T12 to a timing T13 corresponds to the period of 180 degrees to 360 degrees.

Also, in a period of 90 degrees to 270 degrees, the driver 211 sets the drive signal GDC to the low level, sets the drive signal GDB to the high level, and sets the drive signals GDD and GDA to the middle level. In this way, the detection circuit 250 can detect a pixel signal representing the received light amount in the period of 90 degrees to 270 degrees. For example, a period of a timing T14 to a timing T15 corresponds to the period of 90 degrees to 270 degrees.

Also, in a period of 270 degrees to 90 degrees, the driver 211 sets the drive signals GDC and GDB to the middle level, sets the drive signal GDD to the low level, and sets the drive signal GDA to the high level. In this way, the detection circuit 240 can detect a pixel signal representing the received light amount in the period of 270 degrees to 90 degrees. For example, a period of a timing T15 to a timing T16 corresponds to the period of 270 degrees to 90 degrees.

Figure 14:
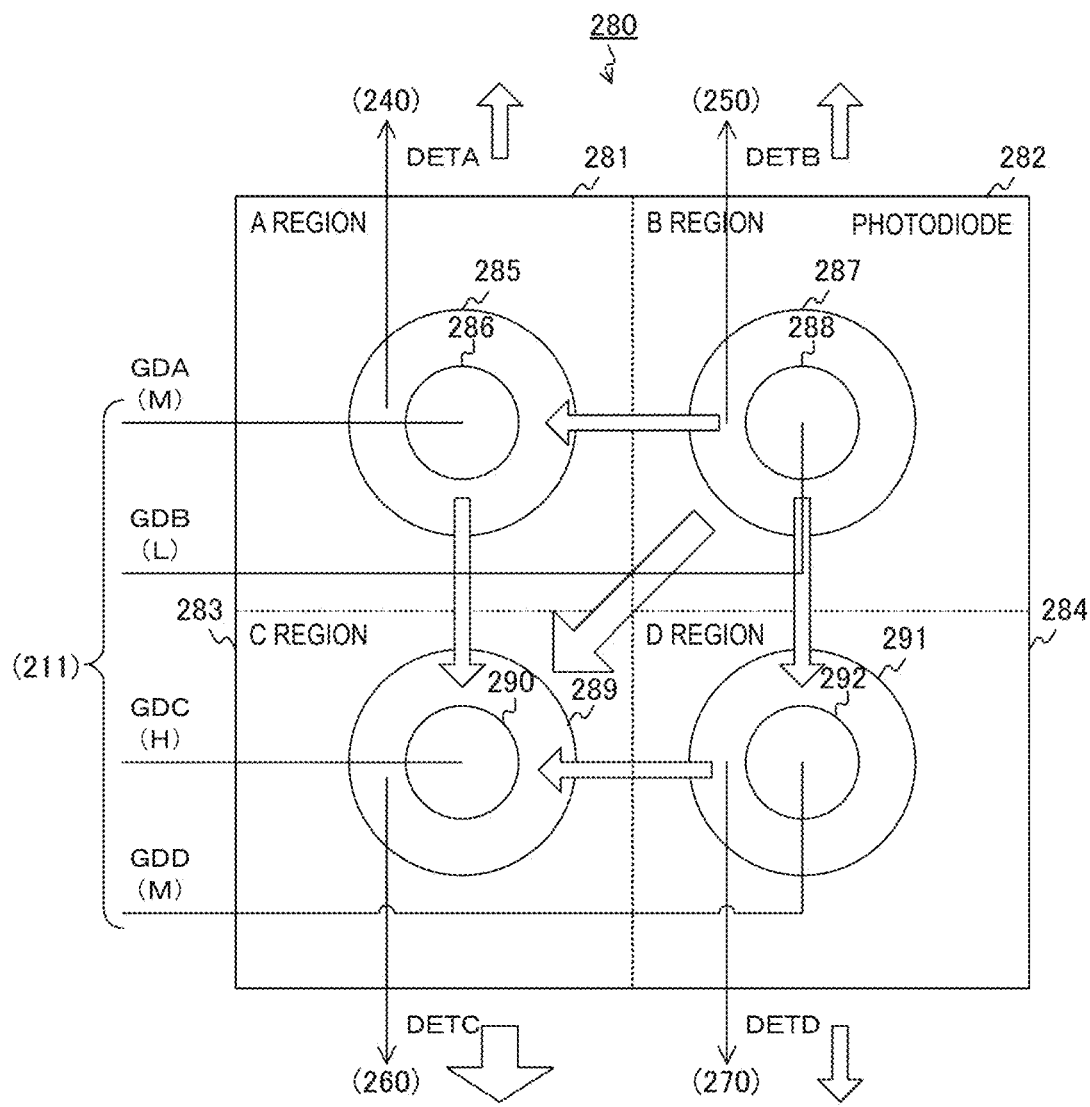
FIG. 14 is an illustration depicting an example of conditions of the photodiode 280 at the time of detection of a received light amount in the period of 0 degrees to 180 degrees in the first embodiment of the present technology.

FIG. 14 is an illustration depicting an example of conditions of the photodiode 280 at the time of detection of the received light amount in the period of 0 degrees to 180 degrees in the first embodiment of the present technology. The driver 211 sets the drive signal GDC to the high level, sets the drive signal GDB to the low level, and sets the drive signals GDD and GDA to the middle level. By the supplies of these potentials, a plurality of electric fields having different directions from each other is generated at the same time. In this case, an electric field from the C region 283 to the other 3 regions, and an electric field from the A region 281 and the D region 284 to the B region 282 are generated.

Then, by the plurality of electric fields, minus electric charges (electrons) are transferred in a direction opposite to the direction of the electric fields. That is, the electric charges are transferred from the B region 282 to the other 3 regions, and the electric charges are transferred from the A region 281 and the D region 284 to the C region 283. As a result, the electric charges are transferred from the detection terminals 285, 287 and 291 in the 3 regions of transfer sources to the detection terminal 289 in the C region 283 at a transfer destination.

In addition, a potential difference between the B region 282 and the C region 283 is largest, and thus the amount of the electric charges transferred between them becomes largest. An arrow in FIG. 14 designates a transfer direction of the electric charges, and a thickness of the arrow designates a transfer amount of the electric charges.

In this regard, distance measurement accuracy SE is represented by the following expression:

$$SE=(A_{pix} \times RE \times FF)^{1/2} \times C_{mod}$$

In the above expression, $A_{pix}$ represents the pixel area, and the unit is, for example, square micrometer ($\mu m^2$); RE represents the quantum efficiency, and the unit is, for example, percent (%); FF represents the numerical aperture, and the unit is, for example, percent (%); $C_{mod}$ represents the transfer efficiency, and the unit is, for example, percent (%).

Assuming that only the A region 281 and the B region 282 are provided (that is, 2 taps), the driver can only generate the electric charges in one direction at a time. In contrast, the photodiode 280 is provided with 4 taps, and thus the driver 211 can generate the electric fields in a plurality of directions. The electric charges from the other three detection terminals are concentrated on the detection terminal 289 located at a position with which the electric fields intersect, and thus the transfer efficiency $C_{mod}$ becomes higher as compared with the case of the 2 taps in which the electric charges are transferred between the two detection terminals. Therefore, the distance measurement accuracy SE can be improved from the above expression.

In addition, assuming that the low level is supplied to all of the three detection terminals (285, 287 and 291) at the transfer sources, the electric charges are not transferred between them; consequently, there is a possibility that sufficient transfer efficiency $C_{mod}$ is not obtained. However, the driver 211 supplies the middle level to two out of the three detection terminals at the transfer sources, and supplies the low level to the remaining one; thus, by a potential difference between them, the electric charges are transferred even between the detection terminals at the transfer sources, so that the transfer efficiency $C_{mod}$ can be enhanced sufficiently.

Figure 15:
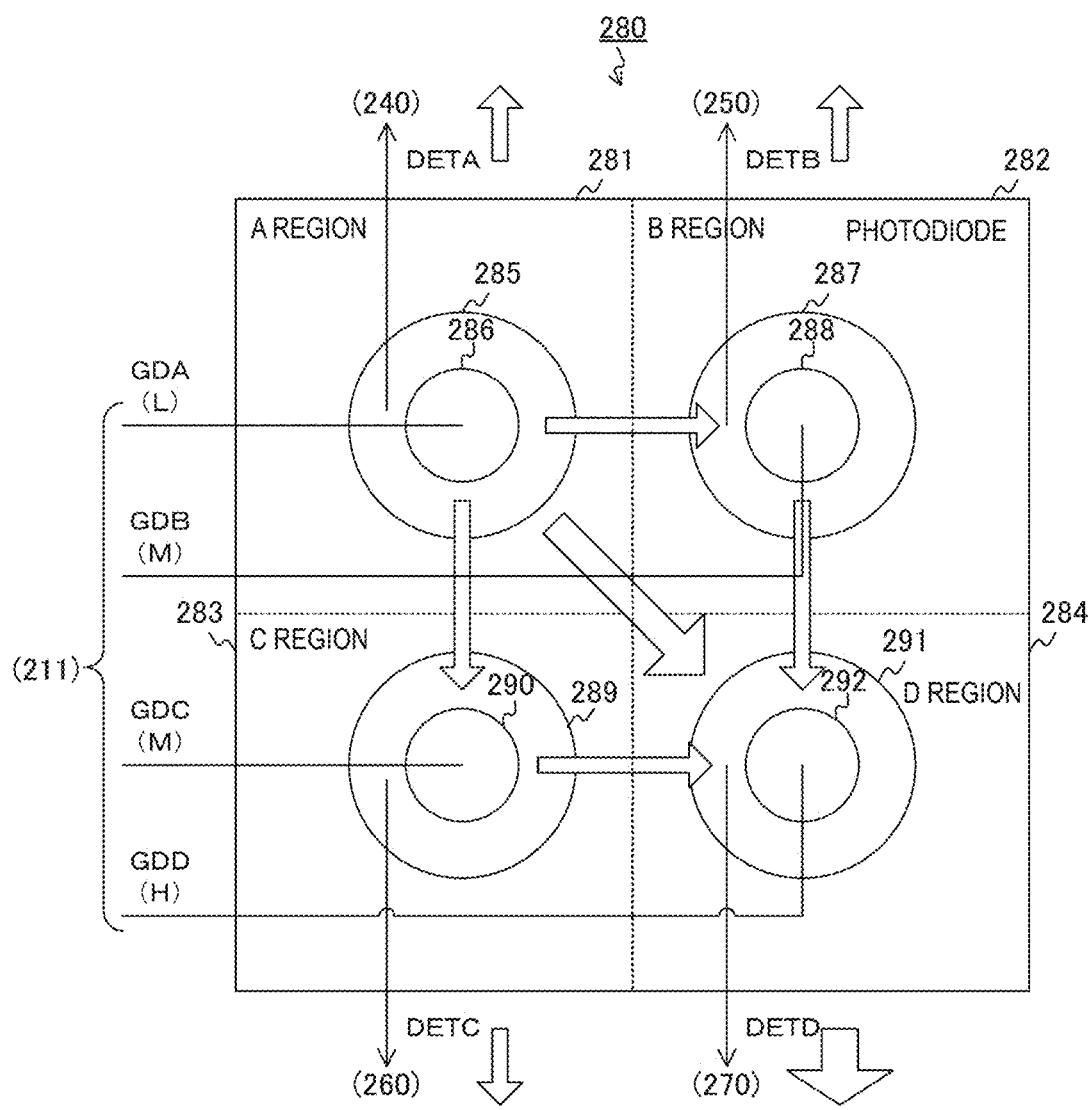
FIG. 15 is an illustration depicting an example of the conditions of the photodiode at the time of detection of the received light amount in the period of 180 degrees to 360 degrees in the first embodiment of the present technology.

FIG. 15 is an illustration depicting an example of the conditions of the photodiode 280 at the time of detection of the received light amount in the period of 180 degrees to 360 degrees in the first embodiment of the present technology. The driver 211 sets the drive signals GDC and GDB to the middle level, sets the drive signal GDD to the high level and sets the drive signal GDA to the low level. In this way, the electric charges are transferred from the A region 281, the B region 282 and the C region 283 to the D region 284.

Figure 16:
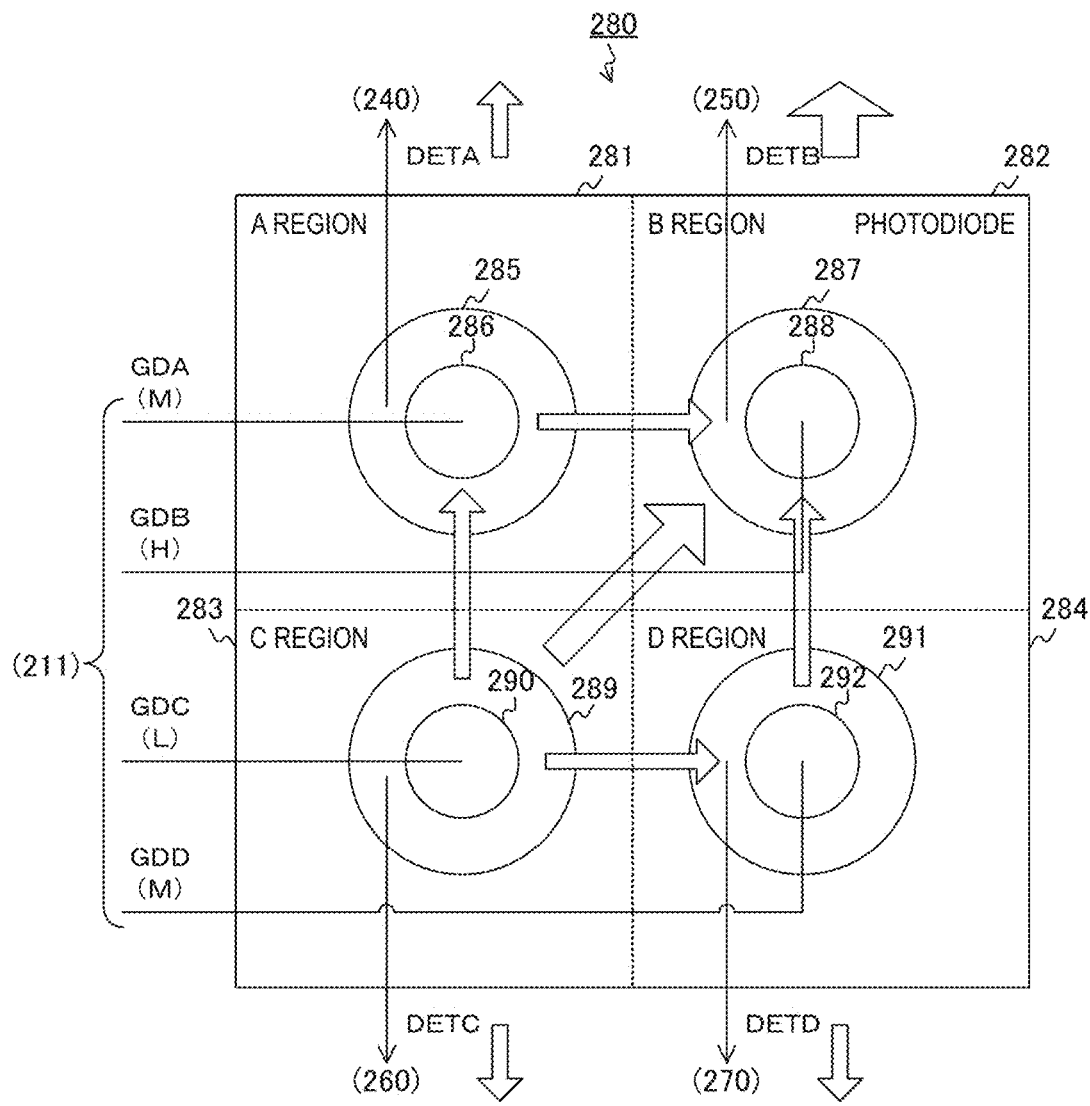
FIG. 16 is an illustration depicting an example of the conditions of the photodiode at the time of detection of the received light amount in the period of 90 degrees to 270 degrees in the first embodiment of the present technology.

FIG. 16 is an illustration depicting an example of the conditions of the photodiode 280 at the time of detection of the received light amount in the period of 90 degrees to 270 degrees in the first embodiment of the present technology. The driver 211 sets the drive signal GDC to the low level, sets the drive signal GDB to the high level and sets the drive signals GDD and GDA to the middle level. In this way, the electric charges are transferred from the A region 281, the C region 283 and the D region 284 to the B region 282.

Figure 17:
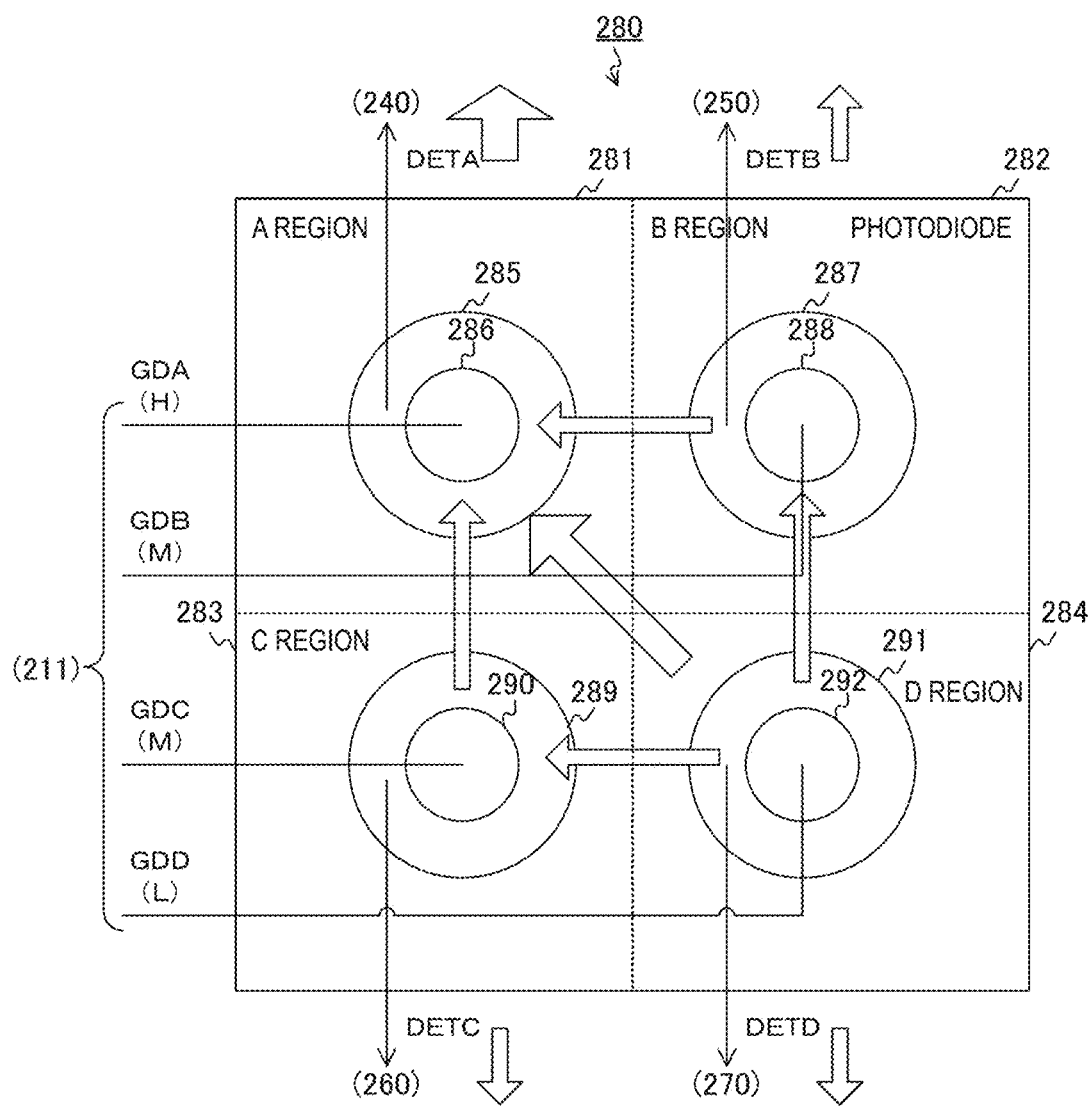
FIG. 17 is an illustration depicting an example of the conditions of the photodiode at the time of detection of the received light amount in the period of 270 degrees to 90 degrees in the first embodiment of the present technology.

FIG. 17 is an illustration depicting an example of the conditions of the photodiode 280 at the time of detection of the received light amount in the period of 270 degrees to 90 degrees in the first embodiment of the present technology. The driver 211 sets the drive signals GDC and GDB to the middle level, sets the drive signal GDD to the low level and sets the drive signal GDA to the high level. In this way, the electric charges are transferred from the B region 282, the C region 283 and D region 284 to the A region 281.

In this case, the pixel signal (received light amount) in the period of 0 degrees to 180 degrees is denoted as q1, and the received light amount of 180 degrees to 360 degrees is denoted as q2. In addition, the received light amount of 90 degrees to 270 degrees is denoted as q3, and the received light amount of 270 degrees to 90 degrees is denoted as q4. The frequency (light-emitting frequency) of the clock signal CLKp is very high, and the received light amounts q1 to q4 each are a minute amount, and hard to be detected directly. For this reason, over a certain integration period, the solid-state imaging device 200 integrates the received light amounts q1 to q4 for each discrete unit 230 to provide received light amounts Q1 to Q4, respectively, and supplies the resultants to the distance measuring section 130.

From the received light amounts Q1 to Q4, the distance measuring section 130 operates a distance d for each discrete unit 230 by the following expression. When the total number of pixels in the pixel array section 220 is denoted as M×N (M and N each are an integer), the number of pixels in the discrete unit 230 is 4, and thus the number of the discrete units 230 is (M×N)/4, and a distance to (M×N)/4 is calculated:

$$d=(c/4\pi f) \times \tan^{-1}\{(Q3-Q4)/(Q1-Q2)\}$$

In the above expression, c is the speed of light, and the unit is, for example, meter per second (m/s); f is the light-emitting frequency of the irradiation light and the unit is, for example, hertz (Hz); and $\tan^{-1}$ is the reverse function of the tangent function.

Configuration Example of Solid-state Imaging Device

Figure 18:
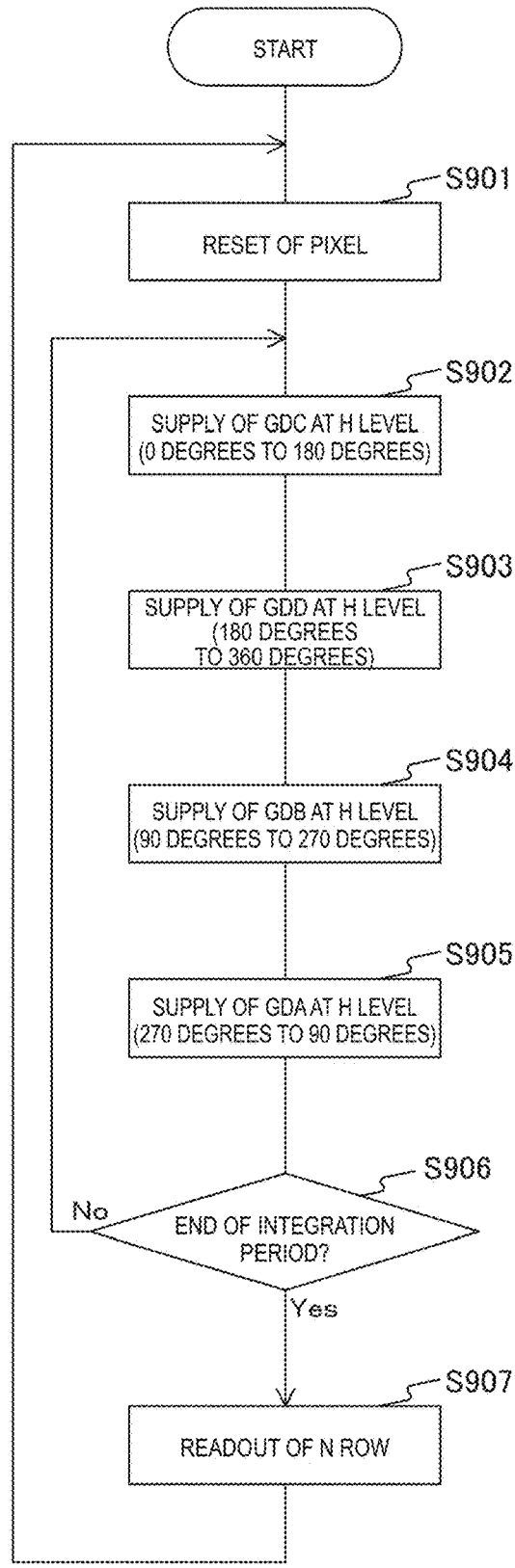
FIG. 18 is a flow chart depicting an example of operations of the solid-state imaging device in the first embodiment of the present technology.

FIG. 18 is a flow chart depicting an example of operations of the solid-state imaging device 200 in the first embodiment of the present technology. The operation is started, for example, when a predetermined application for measuring a distance is carried out.

The solid-state imaging device 200 resets each of the pixels in the reset period of the TOF period (step S901). Then, in the period of 0 degrees to 180 degrees, the solid-state imaging device 200 detects the received light amount in that period by supplying the drive signal GDC at the high level (step S902). Next, in the period of 180 degrees to 360 degrees, the solid-state imaging device 200 detects the received light amount in that period by supplying the drive signal GDD at the high level (step S903).

Subsequently, in the period of 90 degrees to 270 degrees, the solid-state imaging device 200 detects the received light amount in that period by supplying the drive signal GDB at the high level (step S904). Next, in the period of 270 degrees to 90 degrees, the solid-state imaging device 200 detects the received light amount in that period by supplying the drive signal GDA at the high level (step S905).

The solid-state imaging device 200 determines whether or not the integration period ends (step S906). When the integration period does not end (step S906: No), the solid-state imaging device 200 carries out repeatedly the step S902 and later steps.

When the integration period ends (step S906: Yes), the solid-state imaging device 200 reads out sequentially the N rows in the readout period (step S907). After the step S907, the solid-state imaging device 200 carries out repeatedly the step S901 and later steps.

Thus, in the first embodiment of the present technology, since the driver 211 transfers, by the plurality of electric fields, the electric charges from the three detection terminals on the photodiode 280 to the single detection terminal, the number of the detection terminals at the transfer sources is increased as compared to a case where the electric charges are transferred between the two detection terminals. Since the detection terminal at the transfer source is increased from one to three, the transfer efficiency of the electric charges between the detection terminals can be enhanced. In this way, the distance measurement accuracy can be improved.

[Modification]

In the above-described first embodiment, the shapes of the detection terminals 285, 287, 289 and 291 and the electrodes 286, 288, 290 and 292 are formed in a circle; however, these shapes are not limited to the circle, and may be formed in a rectangle, for example. The photodiode 280 in a modification of the first embodiment is different from that of the first embodiment in that the shapes of the detection terminals and the electrodes are formed in the rectangle.

Figure 19:
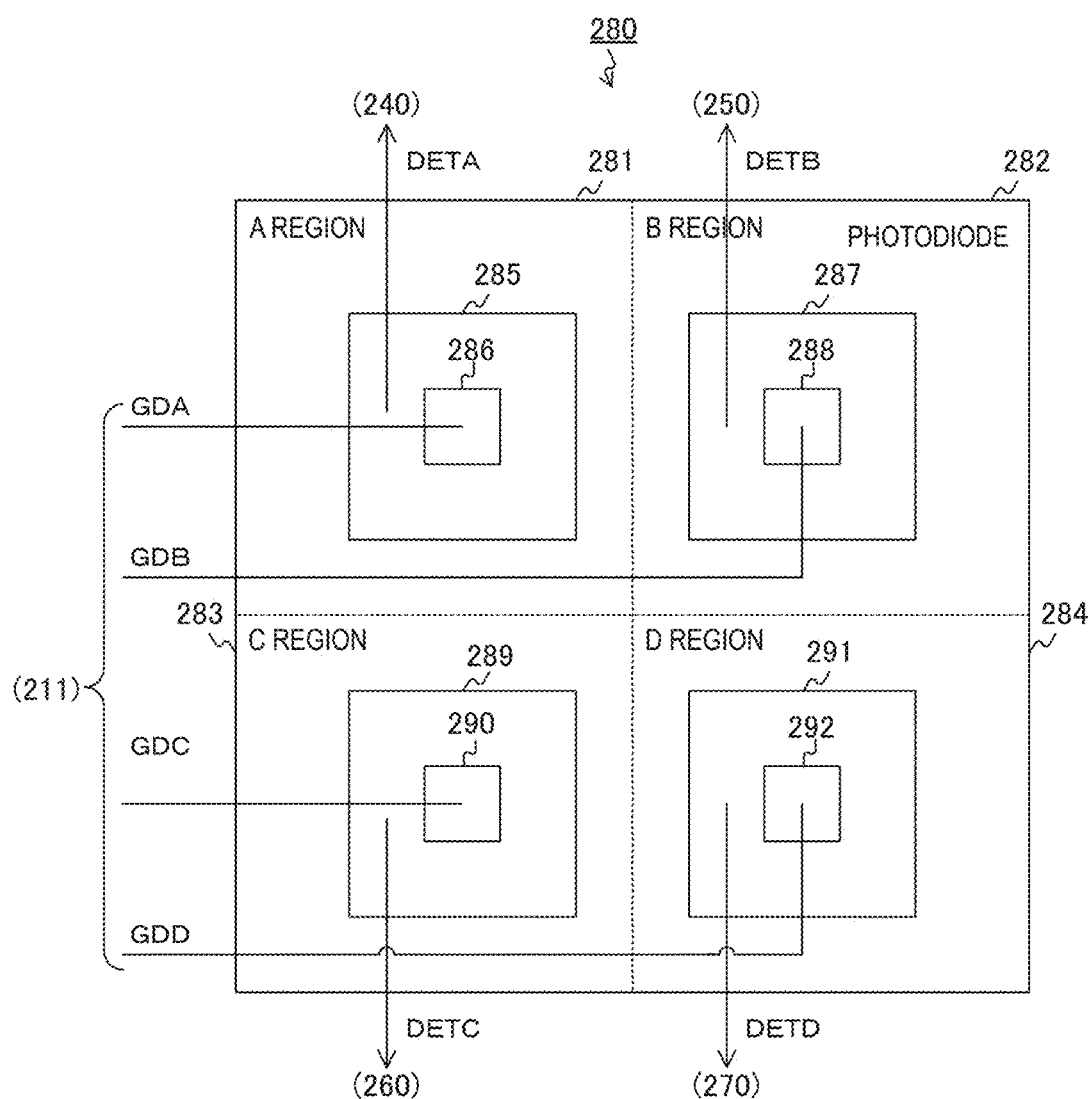
FIG. 19 is an example of plan views of the photodiode in a modification of the first embodiment of the present technology.

FIG. 19 is an example of plan views of the photodiode 280 in the modification of the first embodiment of the present technology. The photodiode 280 in the modification of the first embodiment is different from that of the first embodiment in that the shapes of the detection terminals 285, 287, 289 and 291 and the electrodes 286, 288, 290 and 292 are formed in the rectangle. In a case where the shape of the photodiode 280 is formed in the rectangle, and the area is set to a constant, when the shapes of the electrodes and the detection terminals are formed in the rectangle, as compared to the case where formed in the circular, a ratio of the area of the electrodes and the detection terminals to that of the photodiode 280 can be increased. Note that the respective shapes of the electrodes and the detection terminals may be linear, in addition to the circle and the rectangle.

Thus, in the modification of the present technology, since the electrodes and the detection terminals are formed in the rectangle, a ratio of the area of the electrodes and the detection terminals to that of the photodiode 280 can be increased.

2. Second Embodiment

In the above-described first embodiment, 4 taps are provided in the photodiode 280; however, as the number of the taps in the photodiode 280 is increased, the number of the electrodes and the number of the detection terminals per photodiode 280 are increased, which makes it difficult to implement miniaturization. The photodiode 280 in a second embodiment is different from that of the first embodiment in that the number of the taps is reduced.

Figure 20:
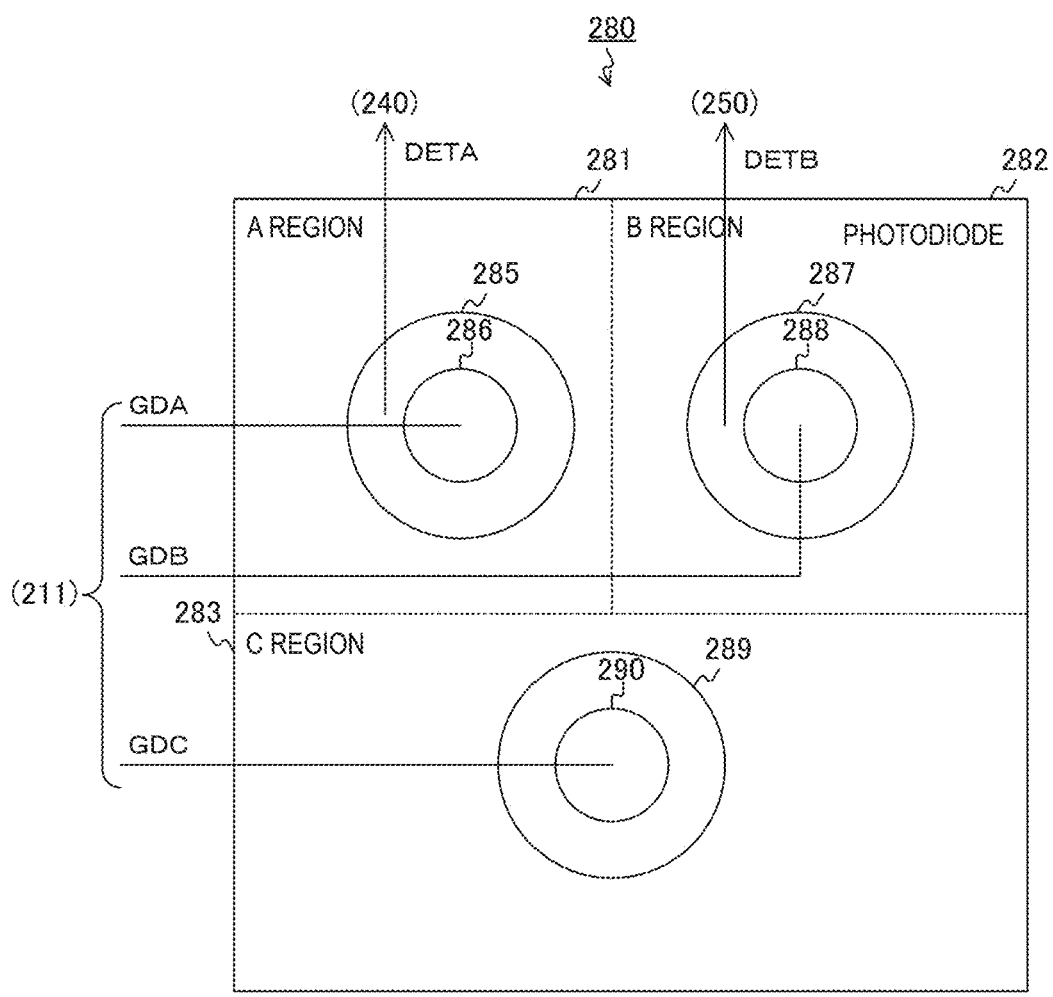
FIG. 20 is an example of plan views of the photodiode in the second embodiment of the present technology.

FIG. 20 is an example of plan views of the photodiode 280 in the second embodiment of the present technology. The photodiode 280 of the second embodiment is different from that of the first embodiment in that the D region 284 is not provided. That is, the number of the taps in the photodiode 280 of the second embodiment is 3. In addition, the detection circuits 260 and 270 are not provided in the discrete unit 230.

The driver 211 sets the drive signal GDA to the high level in the period of 0 degrees to 180 degrees, and sets the remaining drive signals to the low level. In addition, the driver 211 sets the drive signal GDB to the high level in the period of 180 degrees to 360 degrees, and sets the remaining signals to the low level.

The detection circuit 240 detects a received light amount q1 in the period of 0 degrees to 180 degrees. In addition, the detection circuit 250 detects a received light amount q2 in the period of 180 degrees to 360 degrees. The solid-state imaging device 200 integrates the received light amounts q1 and q2, respectively, and supplies the resultants as received light amounts Q1 and Q2 to the distance measuring section 130.

Then, on the basis of the received light amounts Q1 and Q2, the distance measuring section 130 calculates the distance d for each discrete unit 230 by the following expressions:

$$dt = Tp \times \{Q2/(Q1+Q2)\}$$

$$d = c \times dt/2$$

In the above expression, Tp is the light-emitting period of the irradiation light (that is, a period of the clock signal CLKp).

Thus, in the second embodiment of the present technology, since the number of the taps is set to 3, the number of the electrodes and the number of the detection terminals per photodiode 280 can be reduced as compared to the case where the number of the taps is 4.

3. Third Embodiment

In the above-described first embodiment, 4 taps are provided in the photodiode 280; however, when the number of the taps is set to 5 or more, the number of the electrodes is increased, and thus the electric charges are collected from more terminals, so that the transfer efficiency can be further enhanced. The photodiode 280 of the third embodiment is different from that of the first embodiment in that the number of the taps is increased.

Figure 21:
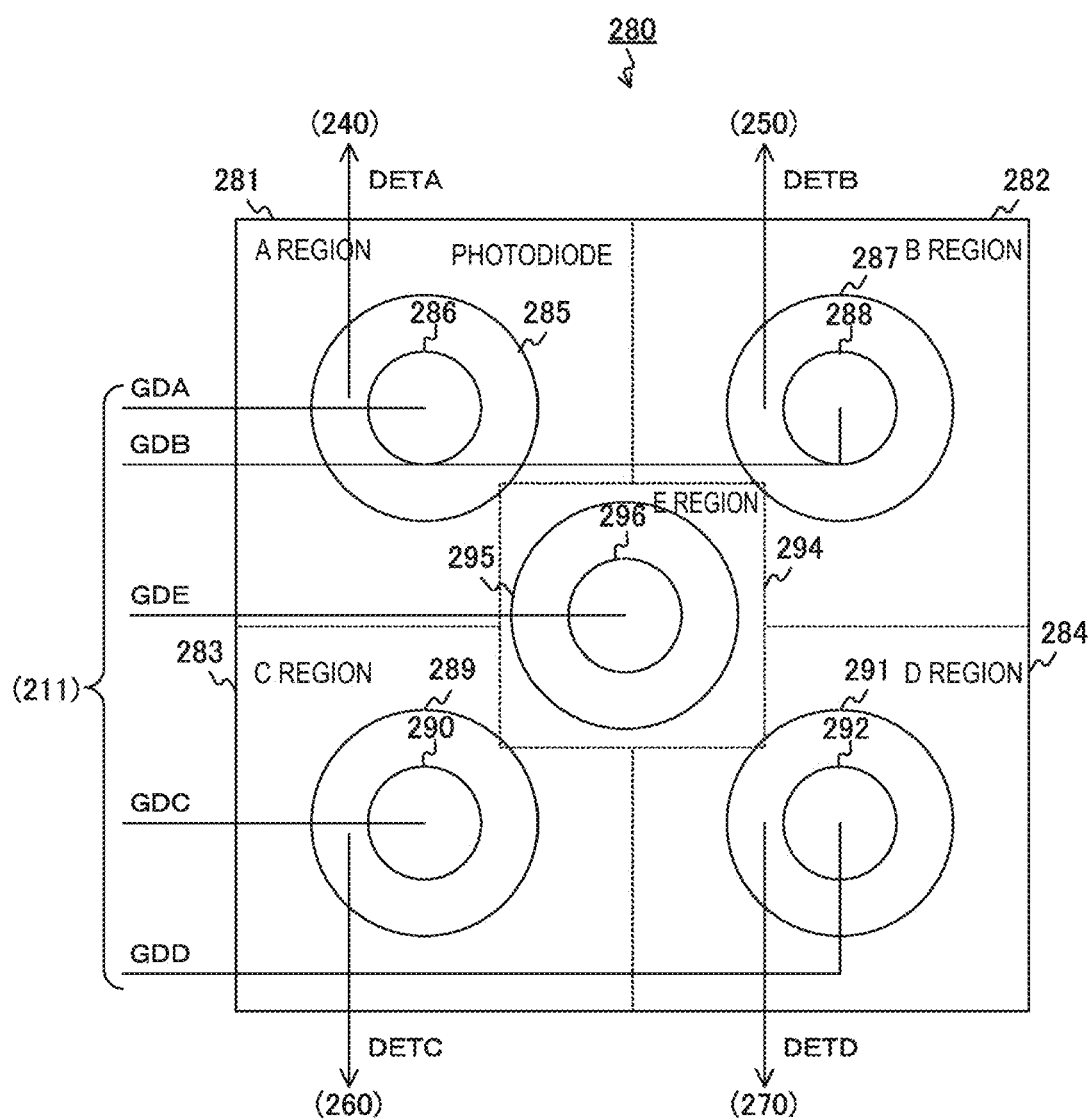
FIG. 21 is an example of plan views of the photodiode in the third embodiment of the present technology.

FIG. 21 is an example of plan views of the photodiode 280 in the third embodiment of the present technology. The photodiode 280 of the third embodiment is different from that of the first embodiment in that an E region 294 is further provided. A detection terminal 295 and an electrode 296 are arranged in the E region 294. A drive signal GDE is inputted to the electrode 296.

The driver 211 controls the potentials of the drive signals GDA, GDB, GDC and GDD in a similar manner to those of the first embodiment. In addition, the driver 211 controls the drive signal GDE to the middle level, for example, in the integration period.

Thus, in the second embodiment of the present technology, since the number of the taps in the photodiode 280 is 5, the number of the electrodes at the transfer sources is increased as compared to the case where the number of the taps is 4. This enables the transfer efficiency to be enhanced.

4. Fourth Embodiment

In the above-described first embodiment, the photodiodes 280 are arrayed on the light receiving surface in a two-dimensional lattice shape; however, with development of miniaturization, a possibility becomes higher that light leaks from one of two adjacent photodiodes 280 to the other. The solid-state imaging device 200 of the fourth embodiment is different from that of the first embodiment in that leakage of the light between the photodiodes is prevented.

Figure 22:
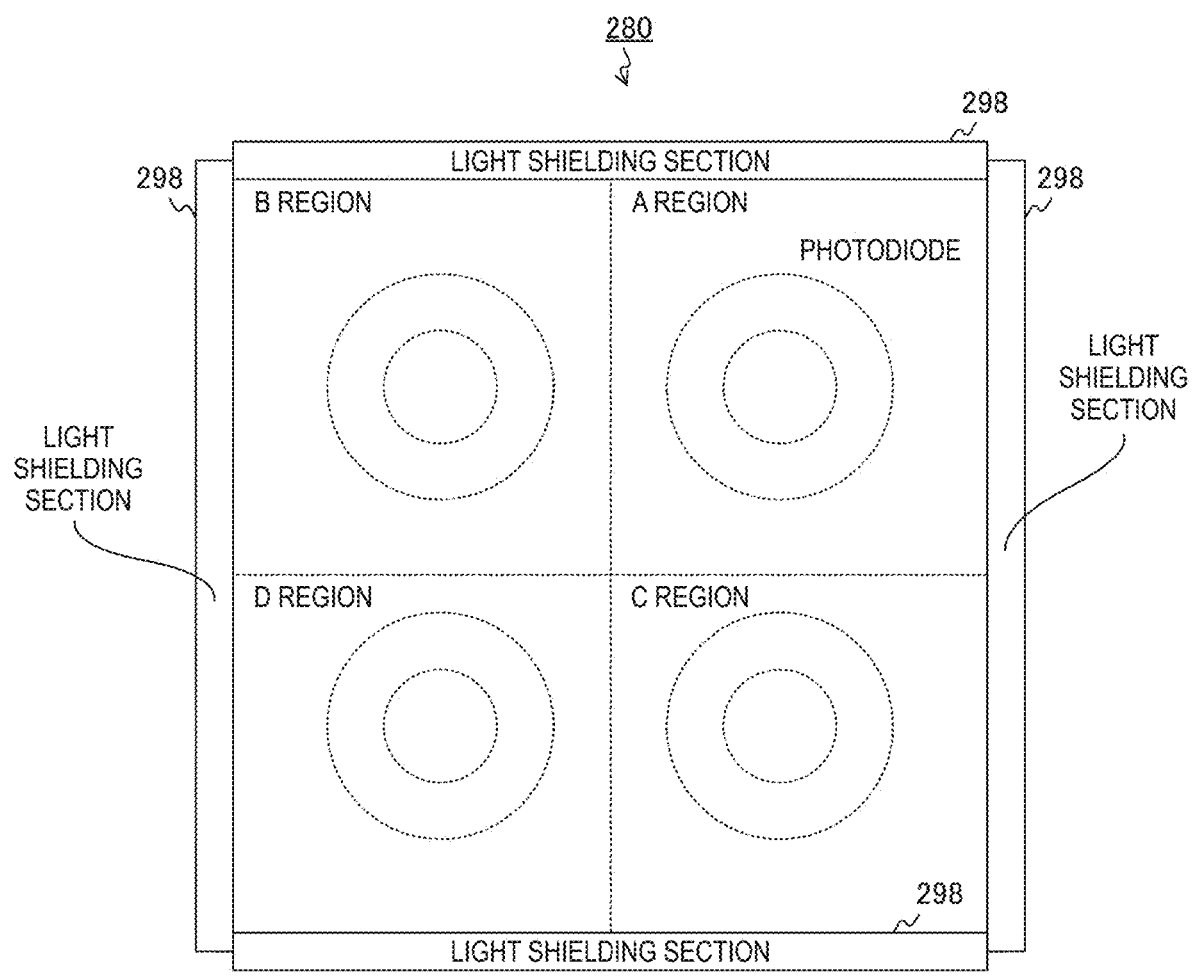
FIG. 22 is an example of plan views from a light receiving surface of the photodiode in the fourth embodiment of the present technology.

FIG. 22 is an example of plan views from the light receiving surface of the photodiode 280 in the fourth embodiment of the present technology. The photodiode 280 of the fourth embodiment is different from that of the first embodiment in that light shielding sections 298 are provided around the photodiode. The light shielding section 298 is configured to shield the light from the adjacent photodiode 280. For example, an oxide film made of silicon dioxide (SiO$_2$) or a layer formed such that impurities are implanted by implant injection is used as the light shielding section 298. Isolation between adjacent discrete units is achieved by the light shielding section 298. A structure isolated with the oxide film may include, for example, an EDI (Expand photo Diode Isolation) and a CION (Concealed Isolation with Oxide burying Nick). Also, a structure isolated by implantation of impurities may include, for example, a FLAT.

Figure 23:
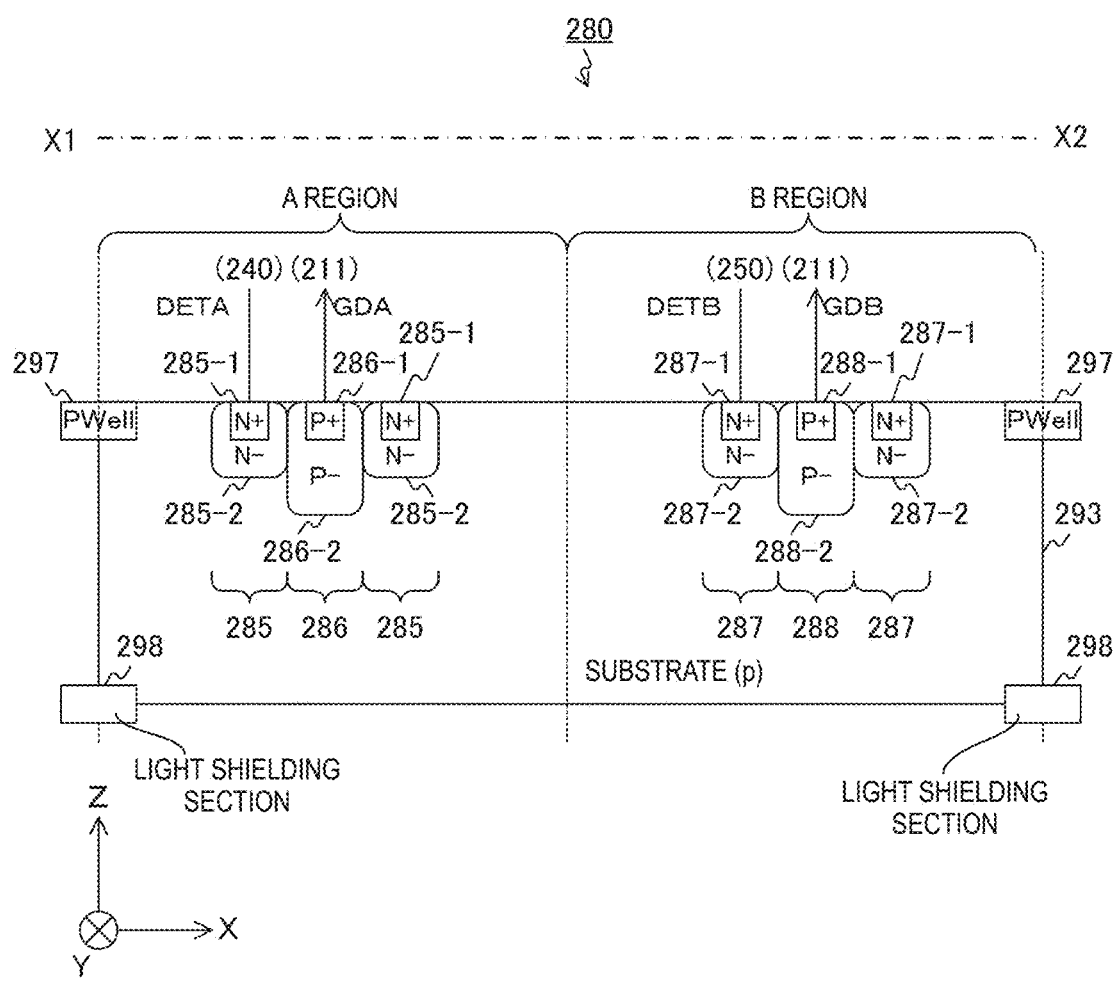
FIG. 23 is an example of cross-sectional views of the photodiode in the fourth embodiment of the present technology.

FIG. 23 is an example of cross-sectional views of the photodiode 280 in the fourth embodiment of the present technology. The light shielding section 298 is provided on a lower side, that is, a light receiving surface side around the photodiode 280. In addition, a P well layer 297 is provided on a wiring surface side.

Thus, according to the fourth embodiment of the present technology, since the light shielding section 298 is provided around the photodiode 280, the leakage of the light between the photodiodes can be prevented, and isolation between the discrete units can be achieved.

5. Fifth Embodiment

In the above-described first embodiment, the driver 211 supplies the drive signals at the high level, the middle level and the low level to the detection terminals. However, in the configuration that also supplies the middle level, as compared to a case that supplies only the high level and the low level, the configuration of the driver 211 becomes complex, so that the circuit scale may be increased. The driver 211 in the fifth embodiment is different from that of the first embodiment in that only the high level and the low level are supplied.

Figure 24:
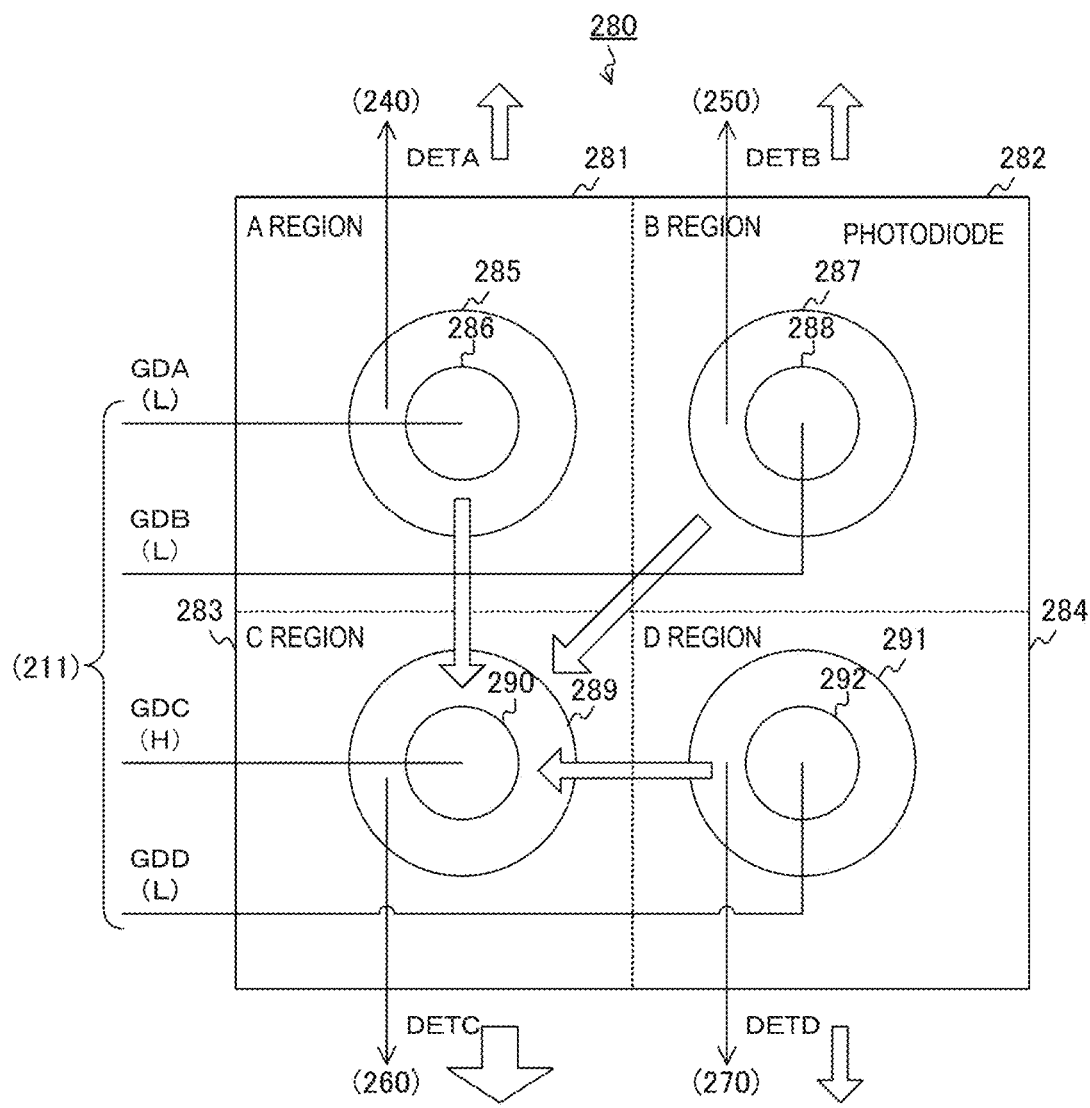
FIG. 24 is an illustration depicting an example of conditions of the photodiode at the time of detection of the received light amount in the period of 0 degrees to 180 degrees in the fifth embodiment of the present technology.

FIG. 24 is an illustration depicting an example of conditions of the photodiode 280 at the time of detection of the received light amount in the period of 0 degrees to 180 degrees in the fifth embodiment of the present technology. The driver 211 sets the drive signal GDC to the high level and sets the remaining drive signals to the low level. In this way, the electric charges are transferred to the C region 283. An Arrow in FIG. 24 designates a transfer direction of the electric charges, and a thickness of the arrow designates a transfer amount of the electric charges. Since a potential difference between each of the A region 281, the B region 282 and the C region 284, and the C region 283 is the same, as illustrated in FIG. 24, the transfer amount from each of the regions becomes equivalent.

Figure 25:
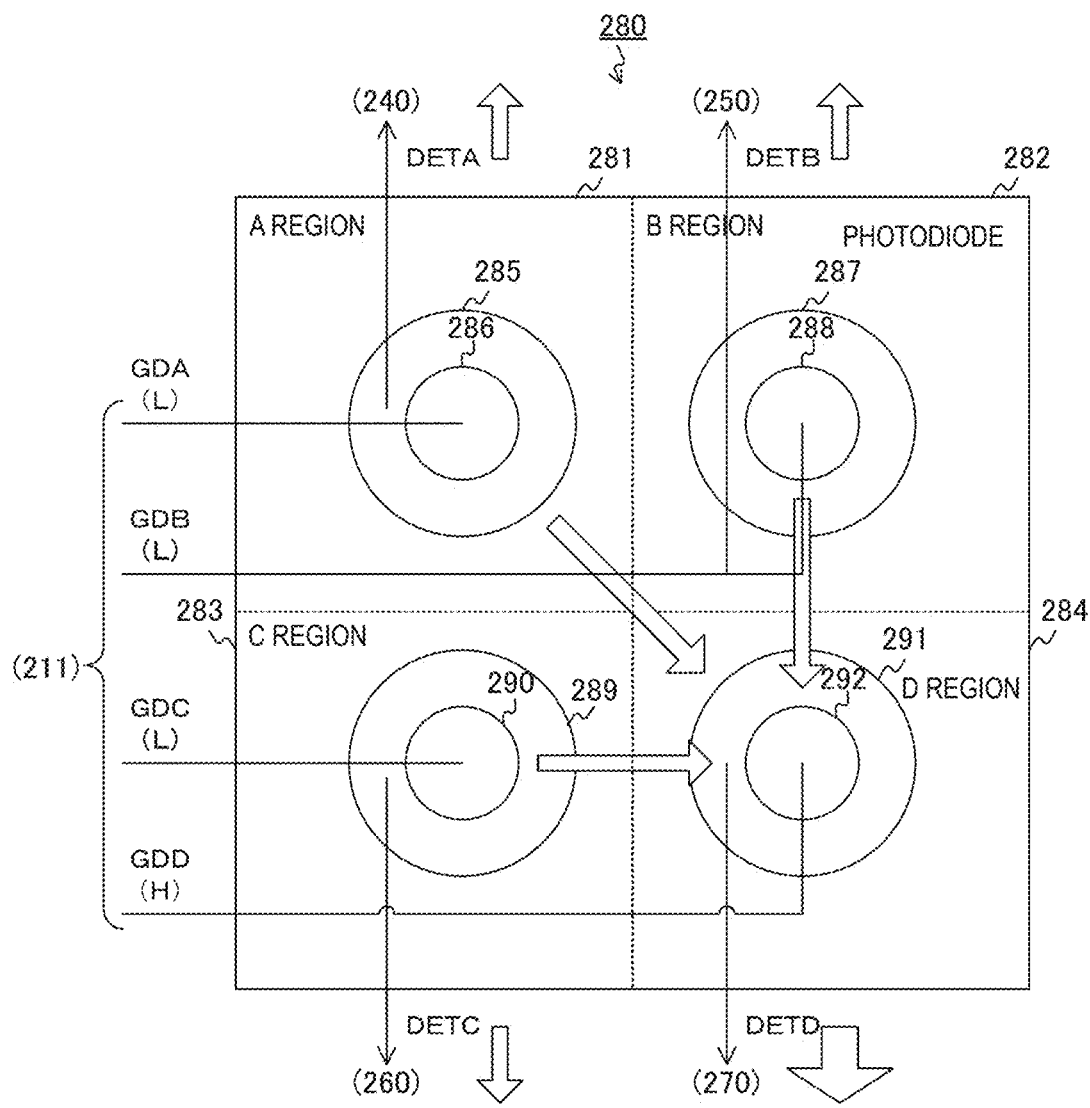
FIG. 25 is an illustration depicting an example of the conditions of the photodiode at the time of detection of the received light amount in the period of 180 degrees to 360 degrees in the fifth embodiment of the present technology.

FIG. 25 is an illustration depicting an example of conditions of the photodiode 280 at the time of detection of the received light amount in the period of 180 degrees to 360 degrees in the fifth embodiment of the present technology. The driver 211 sets the drive signal GDC to the high level and sets the remaining drive signals to the low level. In this way, the electric charges are transferred to the D region 284.

Figure 26:
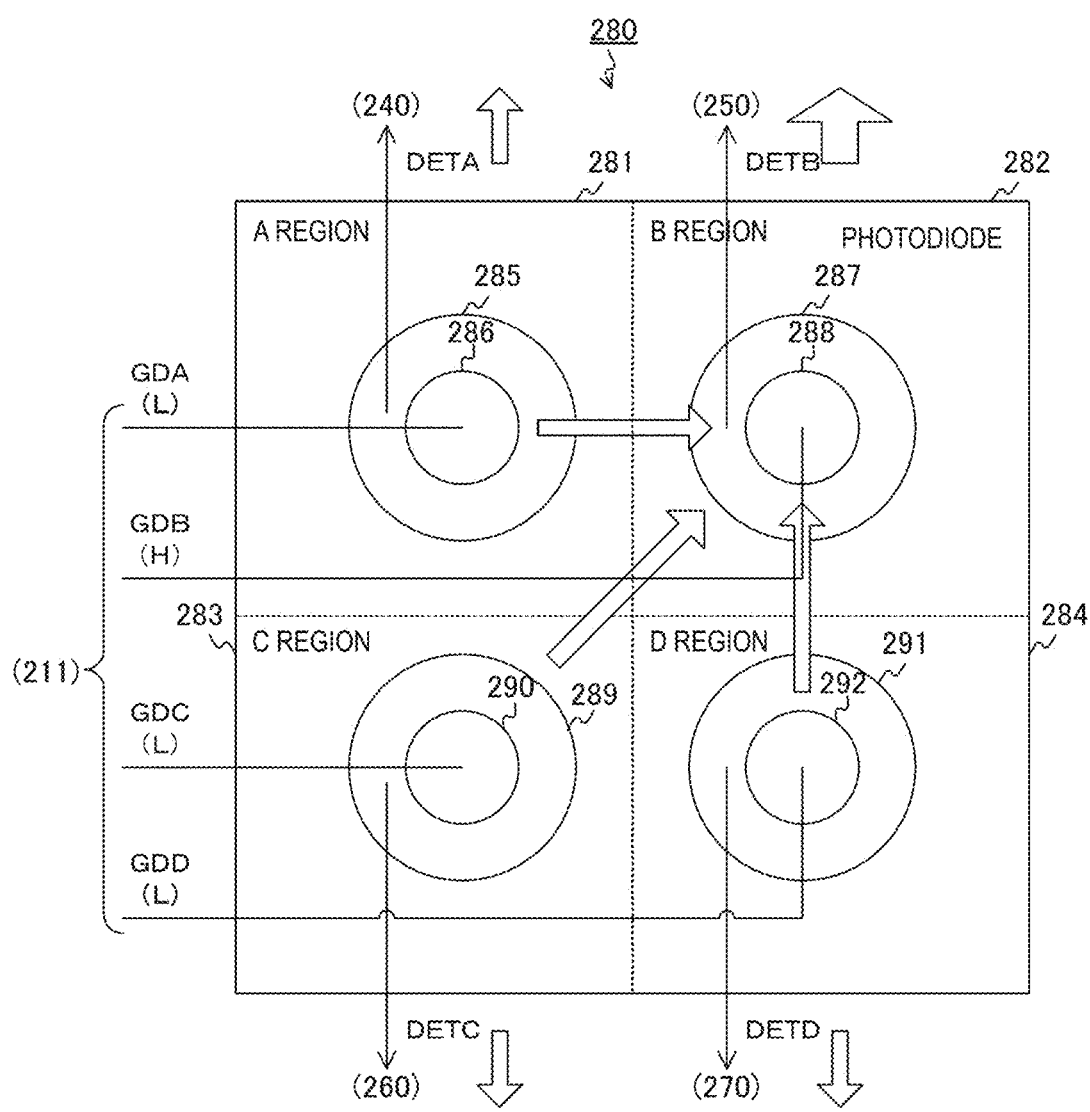
FIG. 26 is an illustration depicting an example of the conditions of the photodiode at the time of detection of the received light amount in the period of 90 degrees to 270 degrees in the fifth embodiment of the present technology.

FIG. 26 is an illustration depicting an example of conditions of the photodiode 280 at the time of detection of the received light amount in the period of 90 degrees to 270 degrees in the fifth embodiment of the present technology. The driver 211 sets the drive signal GDB to the high level and sets the remaining drive signals to the low level. In this way, the electric charges are transferred to the B region 282.

Figure 27:
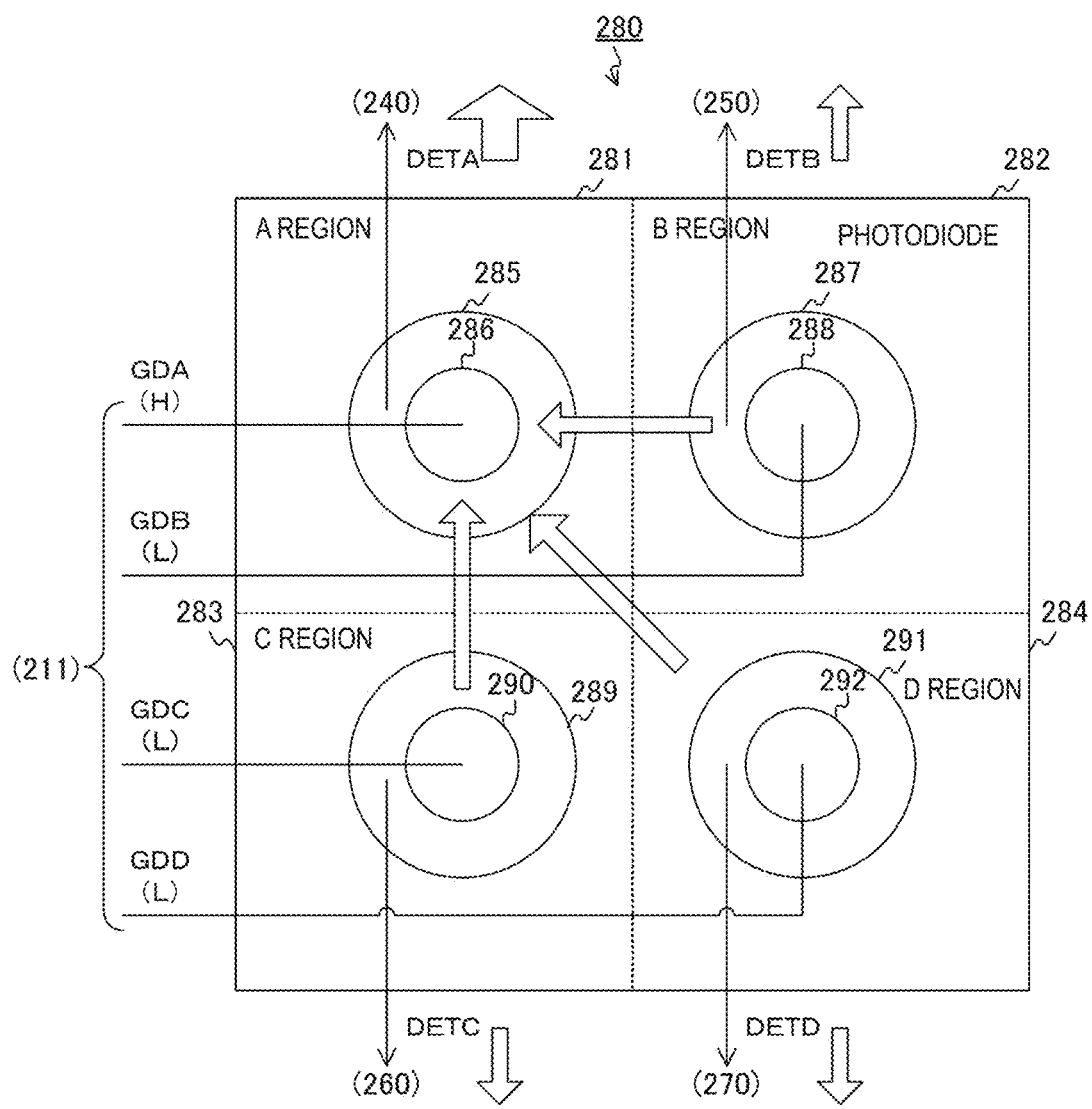
FIG. 27 is an illustration depicting an example of the conditions of the photodiode at the time of detection of the received light amount in the period of 270 degrees to 90 degrees in the fifth embodiment of the present technology.

FIG. 27 is an illustration depicting an example of conditions of the photodiode 280 at the time of detection of the received light amount in the period of 270 degrees to 90 degrees in the fifth embodiment of the present technology. The driver 211 sets the drive signal GDA to the high level and sets the remaining drive signals to the low level. In this way, the electric charges are transferred to the A region 281.

Thus, in the fifth embodiment of the present technology, since the driver 211 supplies the high level and the low level to each of the detection terminals, as compared to the case that also supplies the middle level, the circuit scale of the driver 211 can be reduced.

6. Sixth Embodiment

In the above-described first embodiment, the driver 211 supplies the high level to the detection terminal at the transfer destination, supplies the middle level to two of the three detection terminals at the transfer sources, and supplies the low level to the remaining one. However, as far as the electric charges can be transferred to the detection terminal at the transfer destination, a combination of the levels to be supplied is not limited to that combination. From a viewpoint that reduces the power consumption, for example, it is also possible that the driver supplies the low level to the two out of the three detection terminals at the transfer sources, and supplies the middle level to the remaining one. The driver 211 in the sixth embodiment is different from that of the first embodiment in that the driver supplies the low level to two out of the three detection terminals at the transfer sources, and supplies the middle level to the remaining one.

Figure 28:
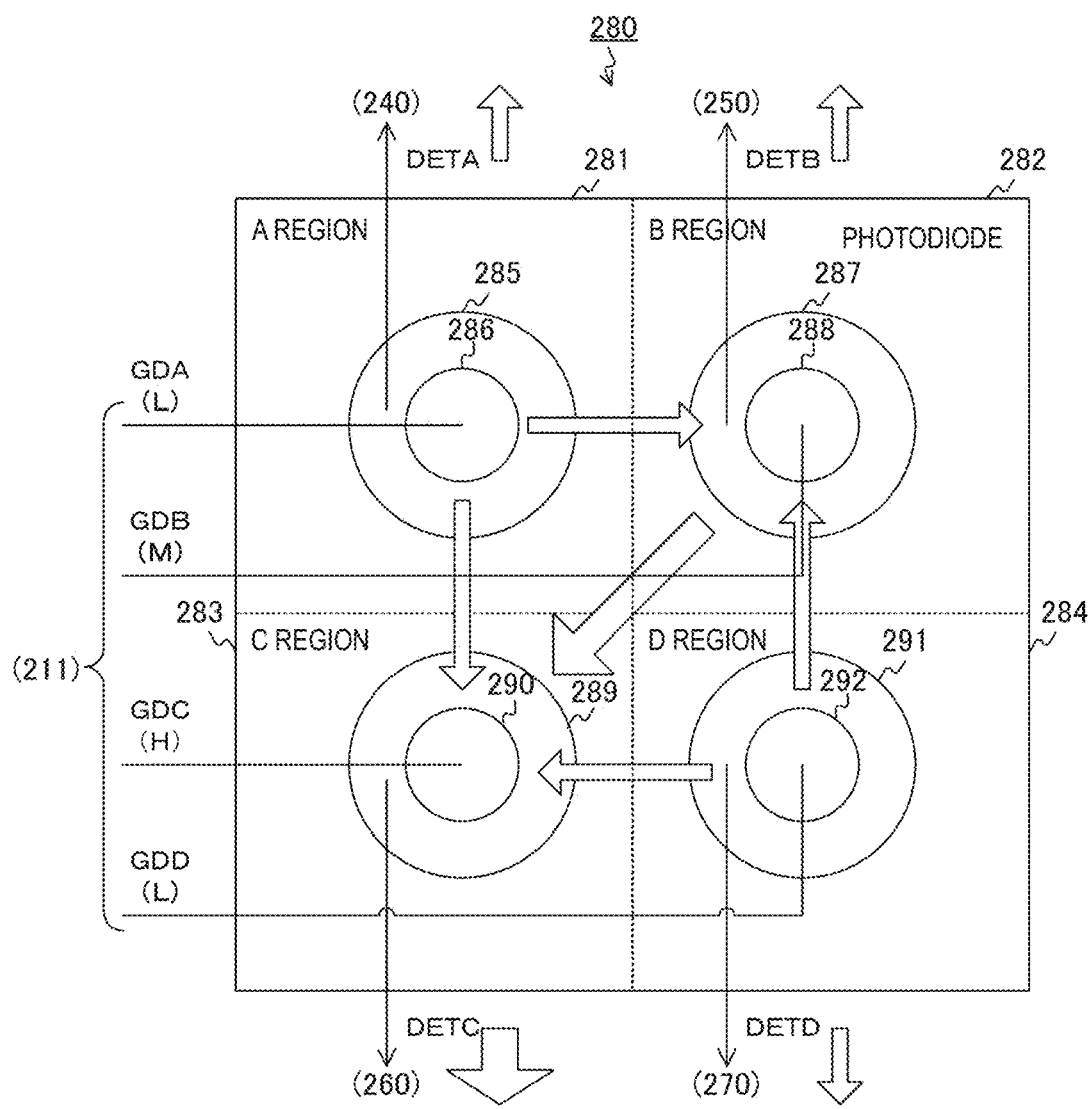
FIG. 28 is an illustration depicting an example of conditions of the photodiode at the time of detection of the received light amount in the period of 0 degrees to 180 degrees in the sixth embodiment of the present technology.

FIG. 28 is an illustration depicting an example of the conditions of the photodiode 280 at the time of detection of the received light amount in the period of 0 degrees to 180 degrees in the sixth embodiment of the present technology. The driver 211 sets the drive signal GDC to the high level, sets the drive signal GDB to the middle level, and sets the drive signals GDD and GDA to the low level. In this way, the electric charges are transferred to the C region 283. An arrow in FIG. 28 designates a transfer direction of the electric charges, and a thickness of the arrow designates a transfer amount of the electric charges. As illustrated in FIG. 28, the electric charges are transferred from the A region 281 and the D region 284 to the B region 282 and the C region 283, and the electric charges are also transferred from the B region 282 to the C region 283.

Figure 29:
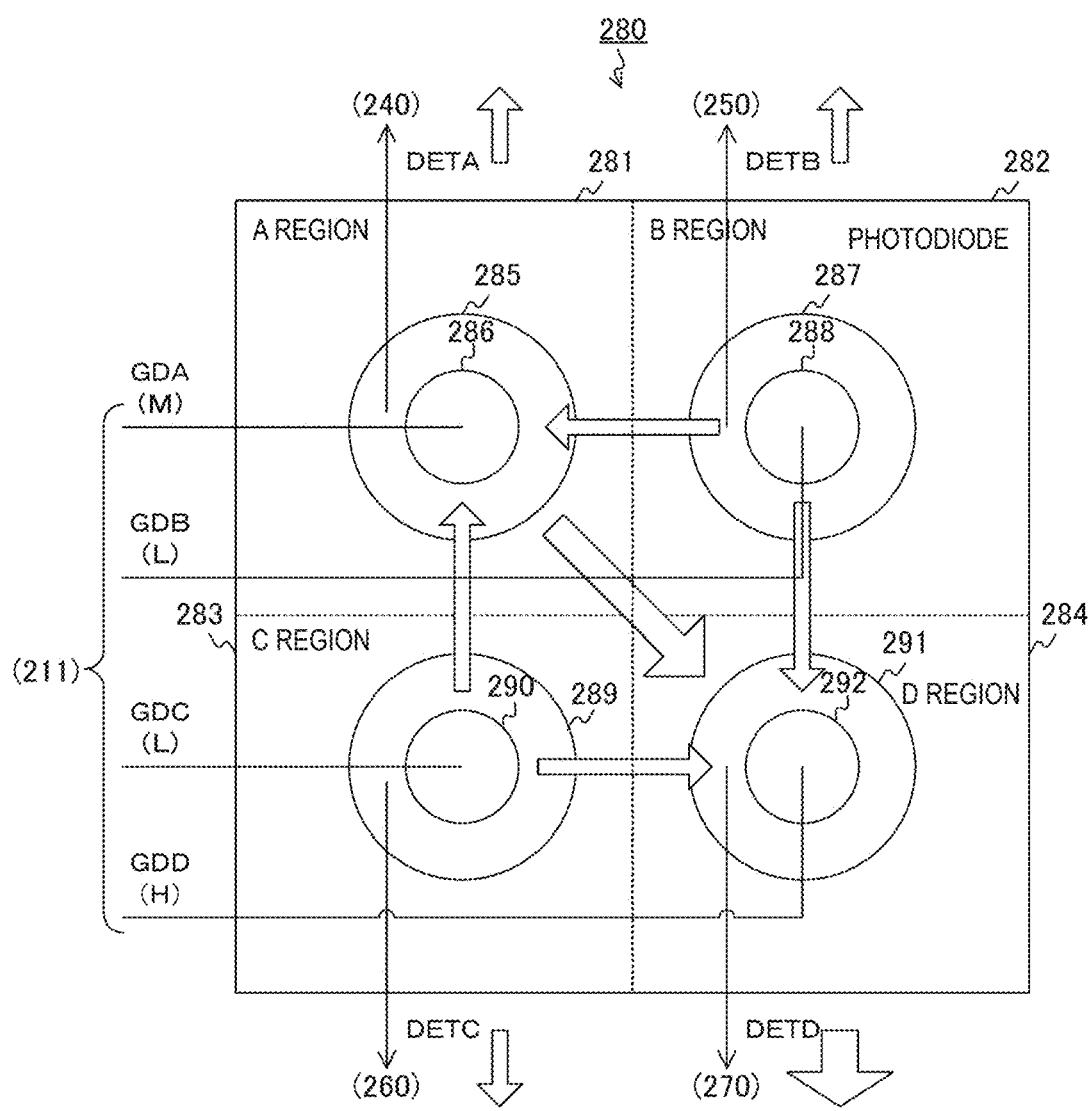
FIG. 29 is an illustration depicting an example of the conditions of the photodiode at the time of detection of the received light amount in the period of 180 degrees to 360 degrees in the sixth embodiment of the present technology.

FIG. 29 is an illustration depicting an example of the conditions of the photodiode 280 at the time of detection of the received light amount in the period of 180 degrees to 360 degrees in the sixth embodiment of the present technology. The driver 211 sets the drive signals GDC and GDB to the low level, sets the drive signal GDD to the high level, and sets the drive signal GDA to the middle level. In this way, the electric charges are transferred to the D region 284.

Figure 30:
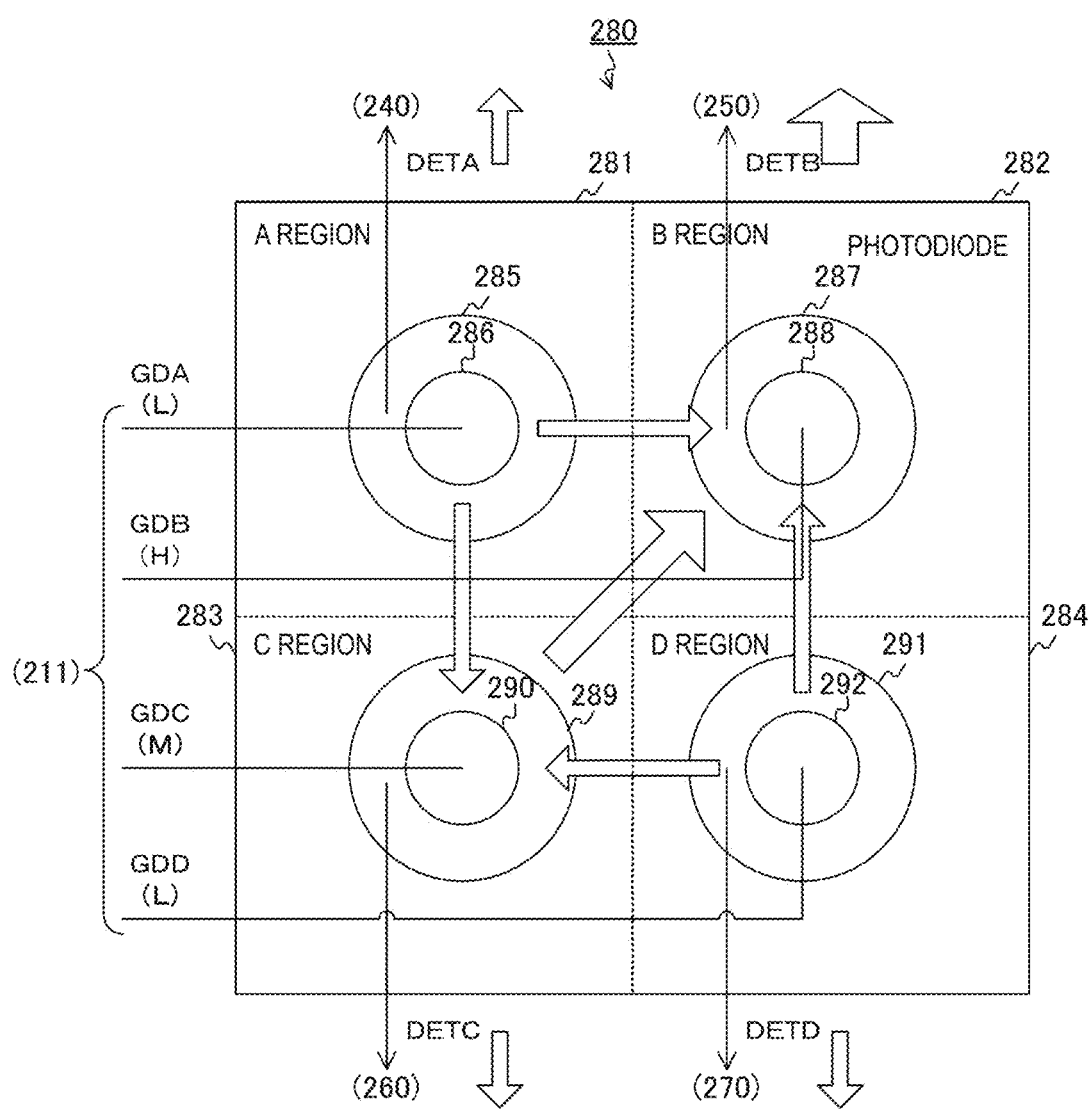
FIG. 30 is an illustration depicting an example of the conditions of the photodiode at the time of detection of the received light amount in the period of 90 degrees to 270 degrees in the sixth embodiment of the present technology.

FIG. 30 is an illustration depicting an example of the conditions of the photodiode 280 at the time of detection of the received light amount in the period of 90 degrees to 270 degrees in the sixth embodiment of the present technology. The driver 211 sets the drive signal GDC to the middle level, sets the drive signal GDB to the high level, and sets the drive signals GDD and GDA to the low level. In this way, the electric charges are transferred to the B region 282.

Figure 31:
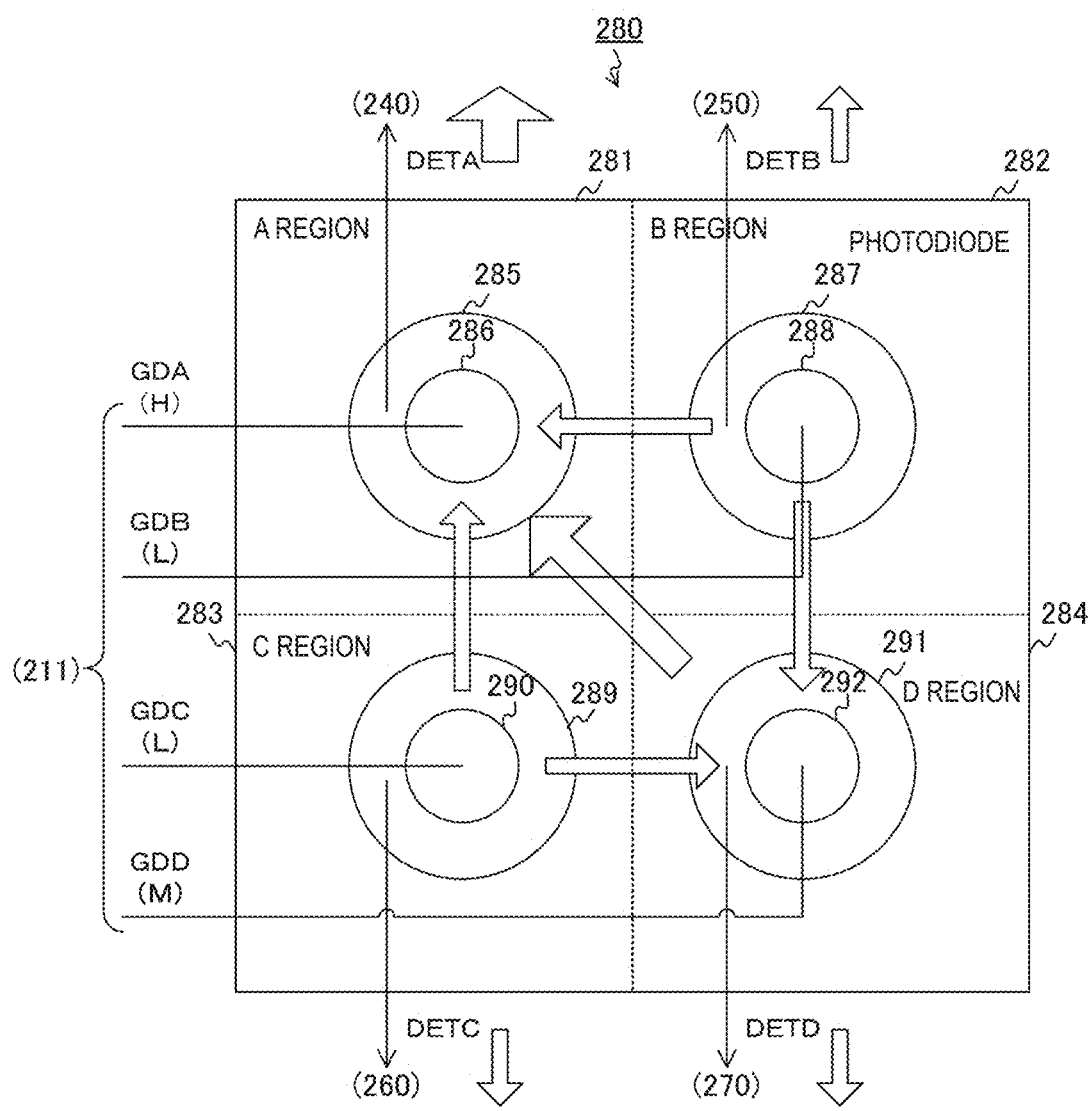
FIG. 31 is an illustration depicting an example of the conditions of the photodiode at the time of detection of the received light amount in the period of 270 degrees to 90 degrees in the sixth embodiment of the present technology.

FIG. 31 is an illustration depicting an example of the conditions of the photodiode 280 at the time of detection of the received light amount in the period of 270 degrees to 90 degrees in the sixth embodiment of the present technology. The driver 211 sets the drive signals GDC and GDB to the low level, sets the drive signal GDD to the middle level, and sets the drive signal GDA to the high level. In this way, the electric charges are transferred to the A region 281.

Thus, in the sixth embodiment of the present technology, since the driver 211 supplies the low level to two out of the three detection terminals at the transfer sources, and supplies the middle level to the remaining one, as compared to the case that supplies the middle level to the two detection terminals, the power consumption can be reduced.

7. Seventh Embodiment

In the above-described first embodiment, the driver 211 supplies the high level to the detection terminal at the transfer destination, supplies the middle level to the two out of the three detection terminals at the transfer sources, and supplies the low level to the remaining one. However, as far as the electric charges can be transferred to the detection terminal at the transfer destination, a combination of the levels to be supplied is not limited to that combination. From a viewpoint that reduces the power consumption, for example, it is also possible that the driver supplies a different potential to each of the three detection terminals at the transfer sources. The driver 211 in the seventh embodiment is different from that of the first embodiment in that the driver supplies a different potential to each of the three detection terminals at the transfer sources.

Figure 32:
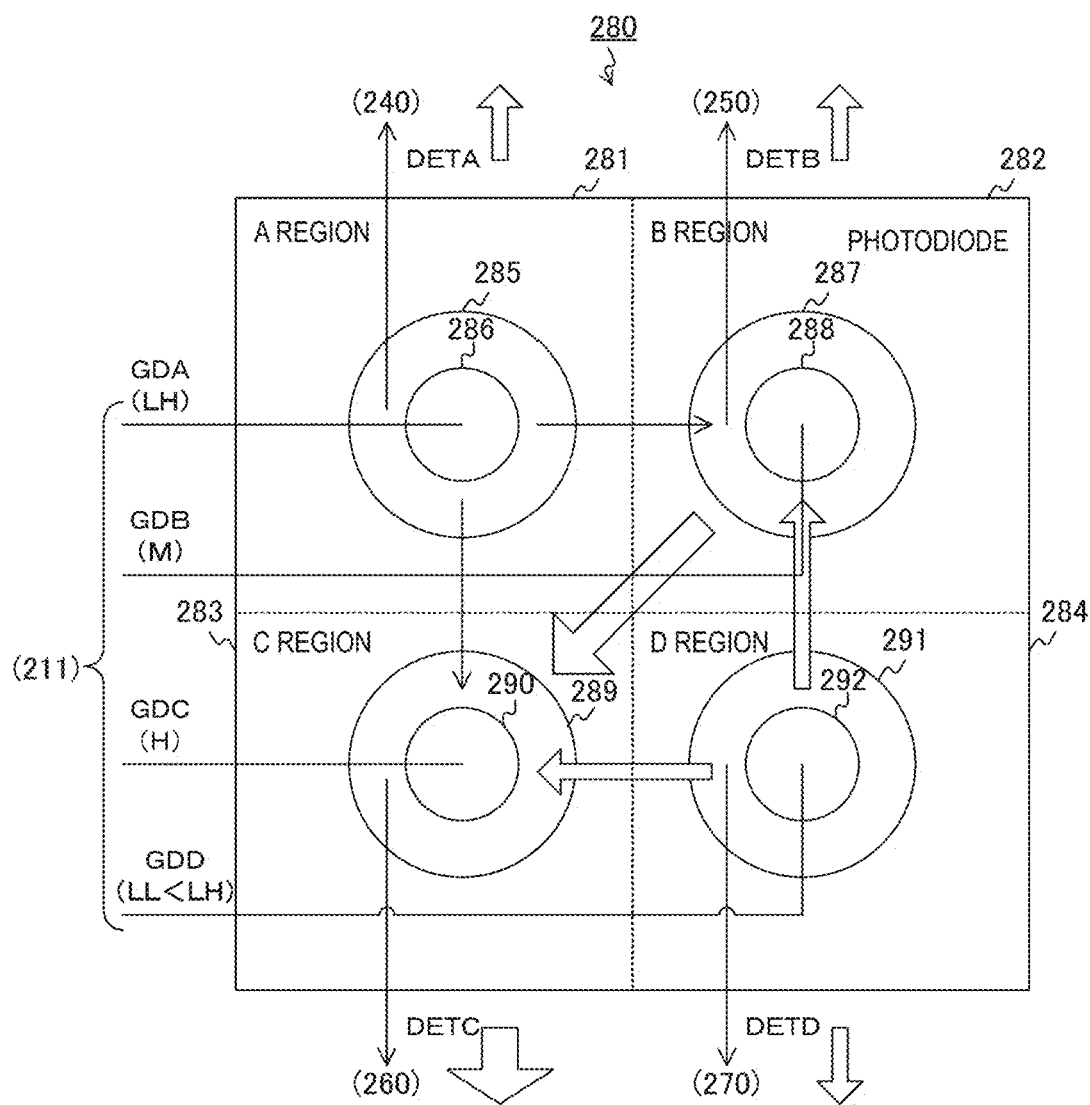
FIG. 32 is an illustration depicting an example of conditions of the photodiode at the time of detection of the received light amount in the period of 0 degrees to 180 degrees in the seventh embodiment of the present technology.

FIG. 32 is an illustration depicting an example of the conditions of the photodiode 280 at the time of detection of the received light amount in the period of 0 degrees to 180 degrees in the seventh embodiment of the present technology. The driver 211 sets the drive signal GDC to the high level, and sets the drive signal GDB to the middle level. In addition, the driver 211 sets the drive signal GDD to an LL level, and sets the drive signal GDA to an LH level. In this case, the low level LH is a potential higher than the low level LL, and lower than the middle level. In this way, the electric charges are transferred to the C region 283. An arrow in FIG. 32 designates a transfer direction of the electric charges, and a thickness of the arrow designates a transfer amount of the electric charges.

In the seventh embodiment, since the driver supplies the middle level to the single detection terminal, the power consumption can be reduced as compared to the first embodiment that supplies the middle level to the two detection terminals.

Figure 33:
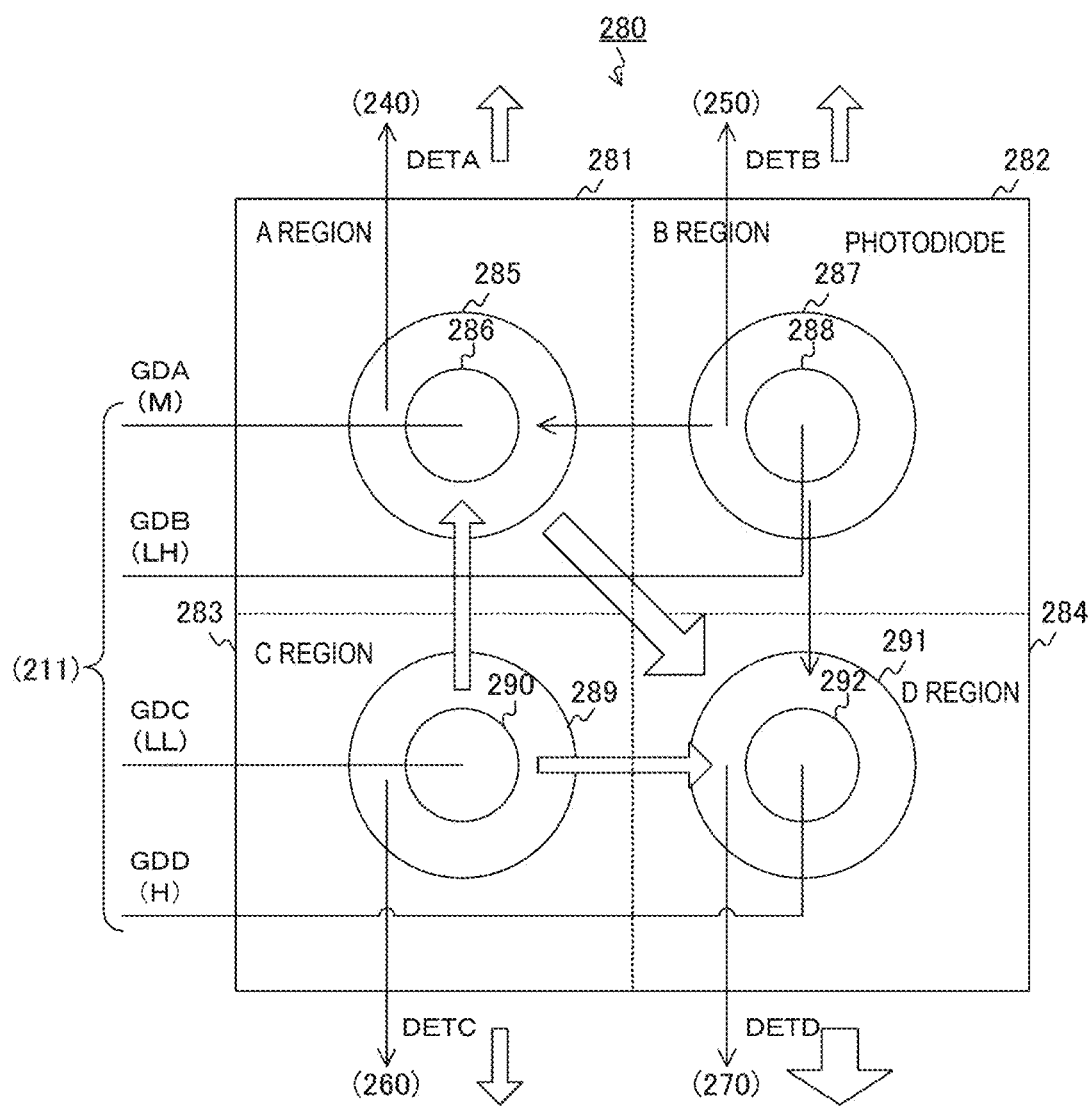
FIG. 33 is an illustration depicting an example of the conditions of the photodiode at the time of detection of the received light amount in the period of 180 degrees to 360 degrees in the seventh embodiment of the present technology.

FIG. 33 is an illustration depicting an example of the conditions of the photodiode 280 at the time of detection of the received light amount in the period of 180 degrees to 360 degrees in the seventh embodiment of the present technology. The driver 211 sets the drive signal GDC to the low level LL, and sets the drive signal GDB to the low level LH. In addition, the driver 211 sets the drive signal GDD to the high level, and sets the drive signal GDA to the middle level. In this way, the electric charges are transferred to the D region 284.

Figure 34:
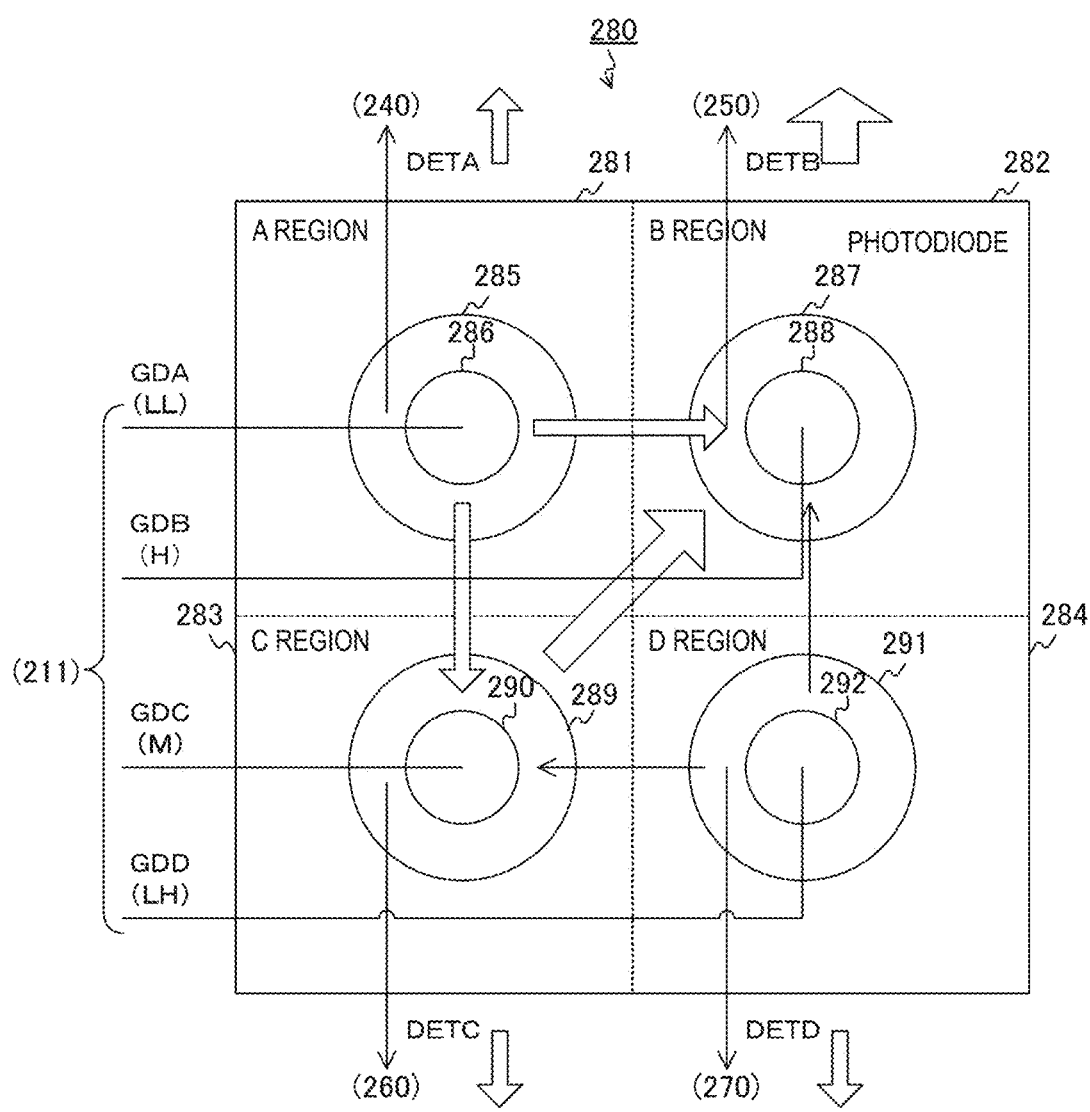
FIG. 34 is an illustration depicting an example of the conditions of the photodiode at the time of detection of the received light amount in the period of 90 degrees to 270 degrees in the seventh embodiment of the present technology.

FIG. 34 is an illustration depicting an example of the conditions of the photodiode 280 at the time of detection of the received light amount in the period of 90 degrees to 270 degrees in the seventh embodiment of the present technology. The driver 211 sets the drive signal GDC to the middle level, and sets the drive signal GDB to the high level. In addition, the driver 211 sets the drive signal GDD to the low level LH, and sets the drive signal GDA to the low level LL. In this way, the electric charges are transferred to the B region 282.

Figure 35:
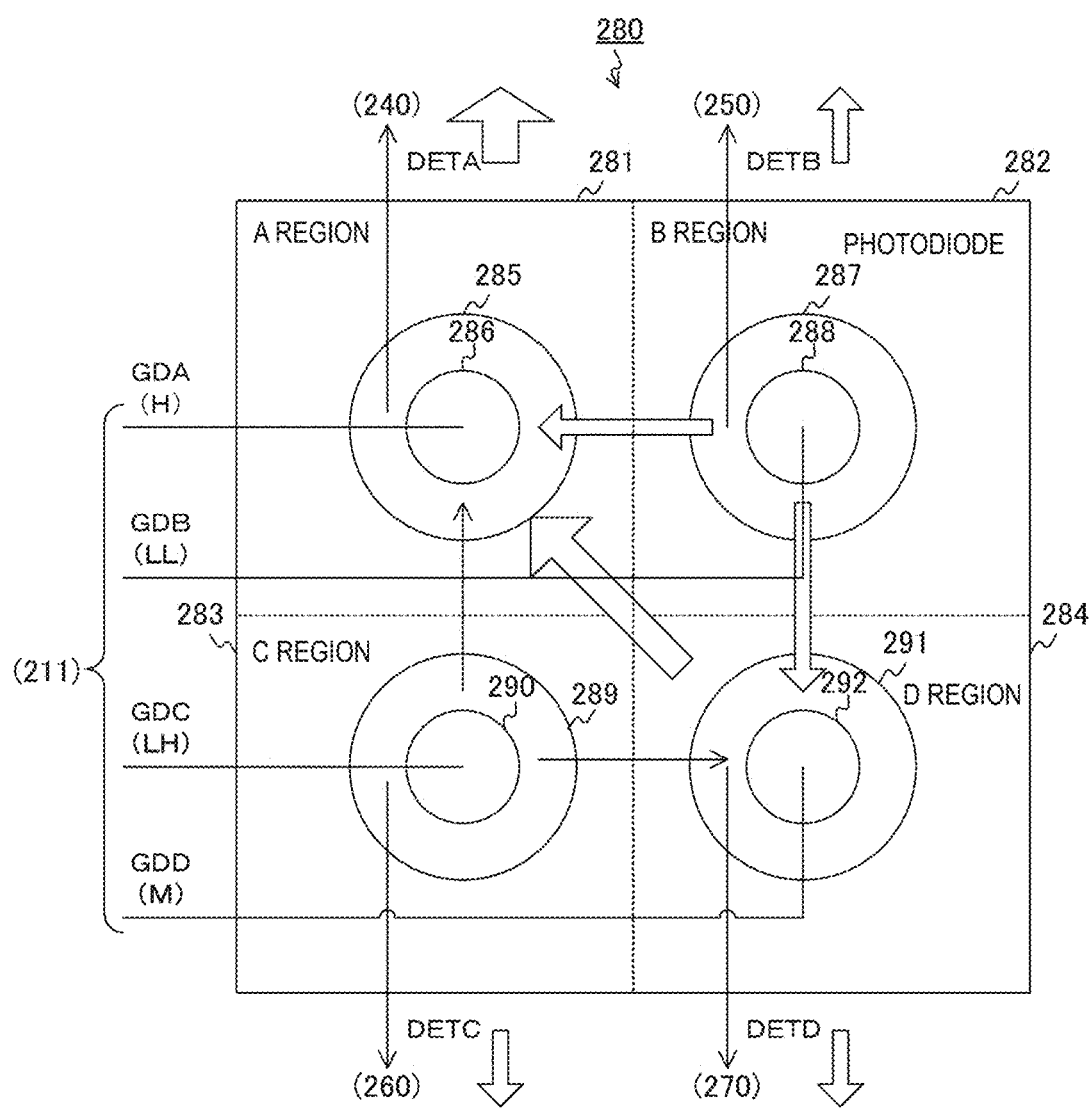
FIG. 35 is an illustration depicting an example of the conditions of the photodiode at the time of detection of the received light amount in the period of 270 degrees to 90 degrees in the seventh embodiment of the present technology.

FIG. 35 is an illustration depicting an example of the conditions of the photodiode 280 at the time of detection of the received light amount in the period of 270 degrees to 90 degrees in the seventh embodiment of the present technology. The driver 211 sets the drive signal GDC to the low level LH, and sets the drive signal GDB to the low level LL. In addition, the driver 211 sets the drive signal GDD to the middle level, and sets the drive signal GDA to the high level. In this way, the electric charges are transferred to the A region 281.

Thus, in the seventh embodiment of the present technology, since the driver 211 supplies the low levels LH and LL to the two out of the three detection terminals at the transfer sources, and supplies the middle level to the remaining one, as compared to the case that supplies the middle level to the two detection terminals, the power consumption can be reduced.

8. Example of Application to Mobile Object

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

Figure 36:
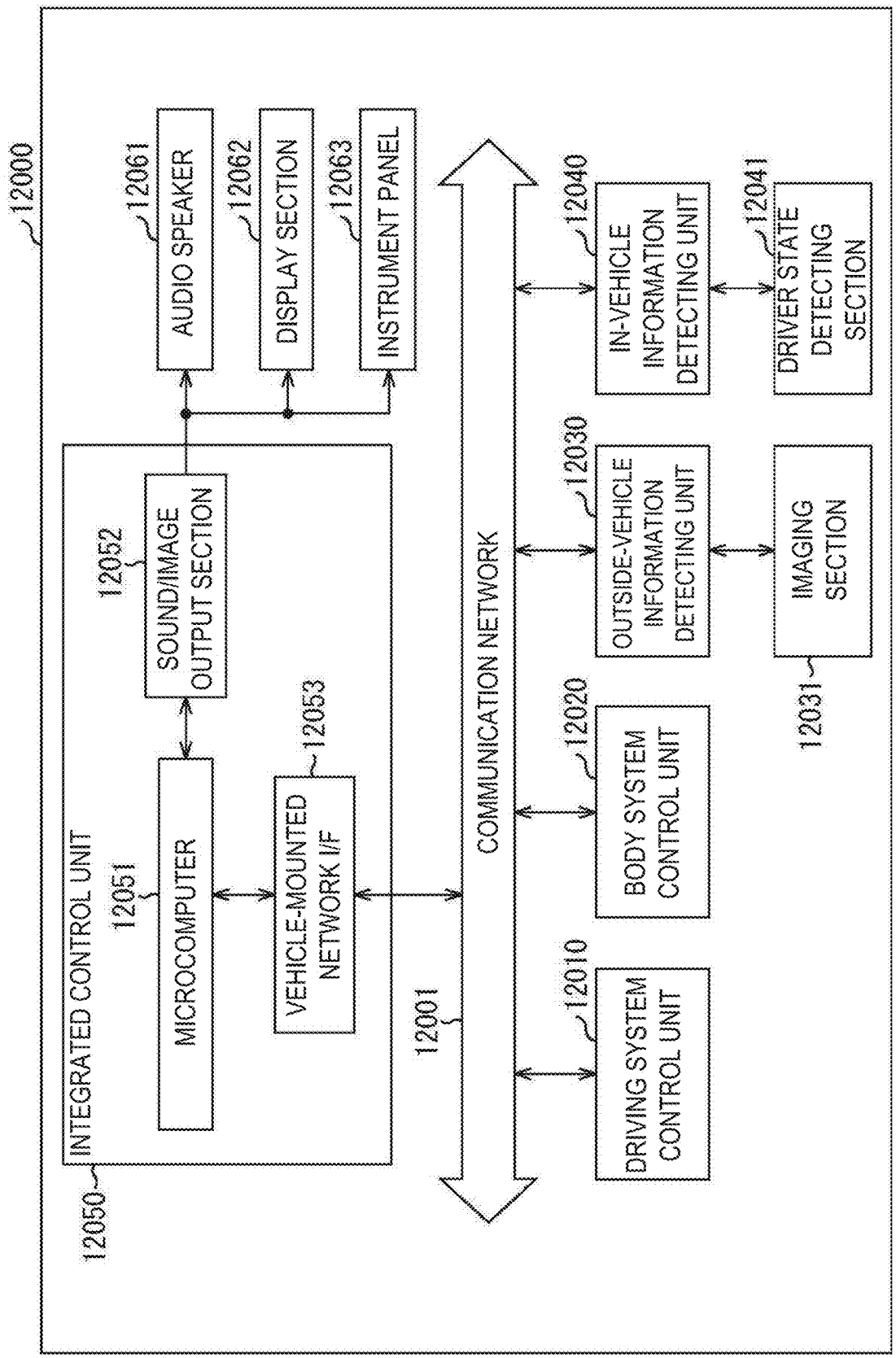
FIG. 36 is a block diagram depicting an example of schematic configuration of a vehicle control system.

FIG. 36 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 36, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 36, an audio speaker 12061, a display section 12062, and an instrument panel 12063 are illustrated as the output device. The display section 12062 may, for example, include at least one of an on-board display and a head-up display.

Figure 37:
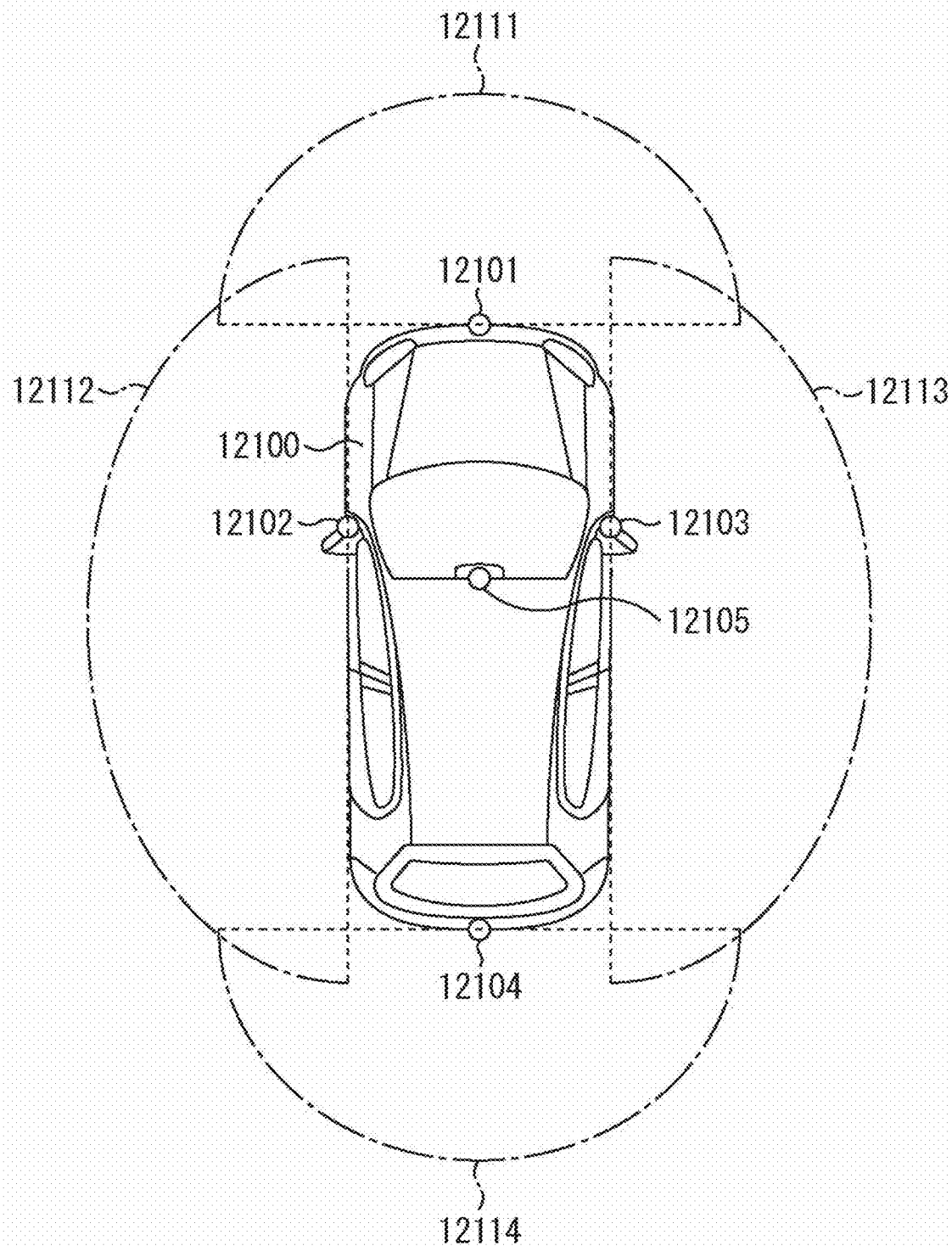
FIG. 37 is a diagram of assistance in explaining an example of installation positions of an imaging section.

FIG. 37 is a diagram depicting an example of the installation position of the imaging section 12031.

In FIG. 37, the imaging section 12031 includes imaging sections 12101, 12102, 12103, 12104, and 12105.

The imaging sections 12101, 12102, 12103, 12104, and 12105 are, for example, disposed at positions on a front nose, side view mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the side view mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 37 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the side view mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the above, an example of the vehicle control system to which the technology related to the present technology can be applied is described. The technology related to the present disclosure can be applied, for example, to the outside-vehicle information detecting unit 12030 in the configurations described above. Specifically, the electronic device in FIG. 1 can be applied to the outside-vehicle information detecting unit 12030. When the technology related to the present disclosure is applied to the outside-vehicle information detecting unit 12030, it becomes possible to enhance the transfer efficiency so as to improve the distance measurement accuracy.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disc), a memory card, and a Blu-ray disc (registered trademark) can be used.

Note that the effects described in the present specification are not necessarily limited, and any effect described in the present disclosure may be exhibited.

Additionally, the present technology may also be configured as below.

(1)

A solid-state imaging device including:

a photoelectric conversion element provided with a plurality of electrodes and a plurality of detection terminals;

a driver that generates at a same time in the photoelectric conversion element a plurality of electric fields having directions different from each other by supplying a potential to each of the plurality of electrodes so as to transfer electric charges from all of detection terminals not corresponding to a transfer destination out of the plurality of detection terminals to a detection terminal at the transfer destination; and a detection section that detects a signal corresponding to a total amount of the electric charges transferred to the detection terminal at the transfer destination.

(2)

The solid-state imaging device according to (1), in which a number of the plurality of electrodes is 4, a number of the plurality of detection terminals is 4, the detection section includes 4 detection circuits connected to the detection terminals different from each other, and the plurality of electrodes is arrayed in a two-dimensional lattice shape.

(3)

The solid-state imaging device according to (2), in which the driver supplies a high potential higher than a predetermined potential to the electrode adjacent to the detection terminal at the transfer source out of the plurality of electrodes, supplies the predetermined potential to the electrode adjacent to each of two detection terminals in which a distance to the transfer source is same, out of the detection terminals not corresponding to the transfer source, and supplies a low potential lower than the predetermined potential to a remaining electrode.

(4)

The solid-state imaging device according to (2), in which the driver supplies a high potential higher than a predetermined potential to the electrode adjacent to the terminal at the transfer source out of the plurality of electrodes, supplies a low potential lower than the predetermined potential to the electrode adjacent to each of two detection terminal in which a distance to the transfer source is same, out of the detection terminals not corresponding to the transfer source, and supplies the predetermined potential to a remaining electrode.

(5)

The solid-state imaging device according to (2), in which the driver supplies a high potential higher than a predetermined potential to the electrode adjacent to the detection terminal at the transfer source out of the plurality of electrodes, supplies a first low potential lower than the predetermined potential to the electrode adjacent to one of two detection terminals in which a distance to the transfer source is same, out of the detection terminals not corresponding to the transfer source, supplies a second low potential lower than the second low potential to the electrode adjacent to another of the two detection terminals, and supplies the predetermined potential to a remaining electrode.

(6)

The solid-state imaging device according to (2), in which the driver supplies a high potential higher than a predetermined potential to the electrode adjacent to the detection terminal at the transfer source out of the plurality of electrodes, and supplies a low potential lower than the predetermined potential to a remaining electrode.

(7)

The solid-state imaging device according to (1), in which a number of the plurality of electrodes is 3,
a number of the plurality of detection terminals is 3,
the detection section includes 3 detection circuits connected to the detection terminals different from each other.

(8)

The solid-state imaging device according to (1), in which a number of the plurality of electrodes is 5,
a number of the plurality of detection terminals is 5,
the detection section includes 5 detection circuits connected to the detection terminals different from each other.

(9)

The solid-state imaging device according to any of (1) to (8), further including:
a light shielding section that shields light from an element adjacent to the photoelectric conversion element to the photoelectric conversion element.

(10)

The solid-state imaging device according to any of (1) to (9), in which
a shape of each of the plurality of electrodes and the plurality of detection terminals is a circle.

(11)

The solid-state imaging device according to any of (1) to (9), in which
a shape of each of the plurality of electrodes and the plurality of detection terminals is a rectangle.

(12)

An electronic device including:
a photoelectric conversion element provided with a plurality of electrodes and a plurality of detection terminals;
a driver that generates at a same time in the photoelectric conversion element a plurality of electric fields having directions different from each other by supplying a potential to each of the plurality of electrodes so as to transfer electric charges from all of detection terminals not corresponding to a transfer destination out of the plurality of detection terminals to a detection terminal at the transfer destination;
a detection section that detects a signal corresponding to a total amount of the electric charges transferred to the detection terminal at the transfer destination; and
a distance measuring section that measures a distance to a predetermined object on a basis of the signal.

(13)

A controlling method of a solid-state imaging device, the controlling method including:
a driving procedure of generating, in a photoelectric conversion element provided with a plurality of electrodes and a plurality of detection terminals, at a same time in the photoelectric conversion element a plurality of electric fields having directions different from each other by supplying a potential to each of the plurality of electrodes so as to transfer electric charges from all of detection terminals not corresponding to a transfer destination out of the plurality of detection terminals to a detection terminal at the transfer destination; and
a detection procedure of detecting a signal corresponding to an amount of the electric charges transferred to the detection terminal at the transfer destination.

REFERENCE SIGNS LIST 100 electronic device
110 light-emitting section
120 synchronous control section
130 distance measuring section
200 solid-state imaging device
211 driver
212 row scanning circuit
213 timing control section
214 column signal processing section
220 pixel array section
230 discrete unit
240, 250, 260, 270 detection circuit
243, 253, 263, 273 reset transistor
244, 254, 264, 274 transfer transistor
245, 255 floating diffusion layer
246, 256 gain control transistor
247, 257 capacitance
248, 258, 268, 278 amplification transistor
249, 259, 269, 279 selection transistor
251 inverter
252 power supply control transistor
280 photodiode
285, 287, 289, 291, 295 detection terminal
285-1, 287-1 N$^+$ layer
285-2, 287-2 N$^-$ layer
286, 288, 290, 292, 296 electrode
286-1, 288-1 P$^+$ layer
286-2, 288-2 P$^-$ layer
293 substrate
294 E region
297 P well layer
298 light shielding section
301, 302, 303, 304 transistor arrangement region
12030 outside-vehicle information detecting unit

The invention claimed is:

1. A solid-state imaging device comprising:
a photoelectric conversion element provided with a plurality of electrodes and a plurality of detection terminals;
a driver electrically connected to the plurality of electrodes, the driver being configured to generate at a same time in the photoelectric conversion element a plurality of electric fields by supplying a potential to each of the plurality of electrodes so as to transfer electric charges from all of detection terminals not corresponding to a transfer destination out of the plurality of detection terminals to a detection terminal at the transfer destination, wherein each generated electric field of the plurality of electric fields originates at a different location and has a direction different from at least one other generated electric field of the plurality of electric fields; and a circuit electrically connected to the detection terminal at the transfer destination, the circuit configured to detect a signal corresponding to a total amount of the electric charges transferred to the detection terminal at the transfer destination.

2. The solid-state imaging device according to claim 1, wherein a number of the plurality of electrodes is 4, a number of the plurality of detection terminals is 4, the circuit includes 4 detection circuits connected to the detection terminals different from each other, and the plurality of electrodes is arrayed in a two-dimensional lattice shape.

3. The solid-state imaging device according to claim 2, wherein the driver is configured to:

supply a high potential higher than a predetermined potential to the electrode adjacent to the detection terminal at the transfer source out of the plurality of electrodes, supply the predetermined potential to the electrode adjacent to each of two detection terminals in which a distance to the transfer source is same, out of the detection terminals not corresponding to the transfer source, and supply a low potential lower than the predetermined potential to a remaining electrode.

4. The solid-state imaging device according to claim 2, wherein the driver is configured to:

supply a high potential higher than a predetermined potential to the electrode adjacent to the terminal at the transfer source out of the plurality of electrodes, supply a low potential lower than the predetermined potential to the electrode adjacent to each of two detection terminals in which a distance to the transfer source is same, out of the detection terminals not corresponding to the transfer source, and supply the predetermined potential to a remaining electrode.

5. The solid-state imaging device according to claim 2, wherein the driver is configured to:

supply a high potential higher than a predetermined potential to the electrode adjacent to the detection terminal at the transfer source out of the plurality of electrodes, supply a first low potential lower than the predetermined potential to the electrode adjacent to one of two detection terminals in which a distance to the transfer source is same, out of the detection terminals not corresponding to the transfer source, supply a second low potential lower than the second low potential to the electrode adjacent to another of the two detection terminals, and supply the predetermined potential to a remaining electrode.

6. The solid-state imaging device according to claim 2, wherein the driver is configured to:

supply a high potential higher than a predetermined potential to the electrode adjacent to the detection terminal at the transfer source out of the plurality of electrodes, and supply a low potential lower than the predetermined potential to a remaining electrode.

7. The solid-state imaging device according to claim 1, wherein a number of the plurality of electrodes is 3, a number of the plurality of detection terminals is 3, and the circuit includes 3 detection circuits connected to the detection terminals different from each other.

8. The solid-state imaging device according to claim 1, wherein a number of the plurality of electrodes is 5, a number of the plurality of detection terminals is 5, and the circuit includes 5 detection circuits connected to the detection terminals different from each other.

9. The solid-state imaging device according to claim 1, further comprising:

a light shield arranged to shield light from an element adjacent to the photoelectric conversion element to the photoelectric conversion element.

10. The solid-state imaging device according to claim 1, wherein a shape of each of the plurality of electrodes and the plurality of detection terminals is a circle.

11. The solid-state imaging device according to claim 1, wherein a shape of each of the plurality of electrodes and the plurality of detection terminals is a rectangle.

12. An electronic device comprising:

a photoelectric conversion element provided with a plurality of electrodes and a plurality of detection terminals;

a driver electrically connected to the plurality of electrodes, the driver being configured to generate at a same time in the photoelectric conversion element a plurality of electric fields by supplying a potential to each of the plurality of electrodes so as to transfer electric charges from all of detection terminals not corresponding to a transfer destination out of the plurality of detection terminals to a detection terminal at the transfer destination, wherein each generated electric field of the plurality of electric fields originates at a different location and has a direction different from at least one other generated electric field of the plurality of electric fields;

a circuit electrically connected to the detection terminal at the transfer destination, the circuit configured to detect a signal corresponding to a total amount of the electric charges transferred to the detection terminal at the transfer destination; and a processor programmed to measure a distance to a predetermined object on a basis of the signal.

13. A controlling method of a solid-state imaging device, the controlling method comprising:

generating, in a photoelectric conversion element provided with a plurality of electrodes and a plurality of detection terminals, at a same time in the photoelectric conversion element a plurality of electric fields by supplying a potential to each of the plurality of electrodes so as to transfer electric charges from all of detection terminals not corresponding to a transfer destination out of the plurality of detection terminals to a detection terminal at the transfer destination, wherein each generated electric field of the plurality of electric fields originates at a different location and has a direction different from at least one other generated electric field of the plurality of electric fields; and detecting a signal corresponding to a total amount of the electric charges transferred to the detection terminal at the transfer destination.

* * * * *